(12) United States Patent
Suk

(10) Patent No.: US 11,152,309 B2
(45) Date of Patent: Oct. 19, 2021

(54) SEMICONDUCTOR PACKAGE, METHOD OF FABRICATING SEMICONDUCTOR PACKAGE, AND METHOD OF FABRICATING REDISTRIBUTION STRUCTURE

(71) Applicant: SAMSUNG ELECTRONICS CO., LTD., Suwon-si (KR)

(72) Inventor: Kyoung Lim Suk, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 85 days.

(21) Appl. No.: 16/411,586

(22) Filed: May 14, 2019

(65) Prior Publication Data

US 2020/0111747 A1  Apr. 9, 2020

(30) Foreign Application Priority Data

Oct. 5, 2018 (KR) .......................... 10-2018-0119089

(51) Int. Cl.
| | |
|---|---|
| *H01L 23/538* | (2006.01) |
| *H01L 21/48* | (2006.01) |
| *H01L 23/498* | (2006.01) |
| *H01L 23/31* | (2006.01) |

(Continued)

(52) U.S. Cl.
CPC ...... *H01L 23/5389* (2013.01); *H01L 21/4857* (2013.01); *H01L 23/3128* (2013.01); *H01L 23/49822* (2013.01); *H01L 23/49838* (2013.01); *H01L 23/5383* (2013.01); *H01L 23/5386* (2013.01); *H01L 24/16* (2013.01); *H01L 25/105* (2013.01); *H01L 2224/16225* (2013.01); *H01L 2225/1035* (2013.01);
(Continued)

(58) Field of Classification Search
CPC ..................... H01L 2924/15153–15157; H01L 2924/15174; H01L 2924/15184; H01L 23/5383; H01L 23/5386; H01L 23/5389
See application file for complete search history.

(56) References Cited

U.S. PATENT DOCUMENTS

| | | | |
|---|---|---|---|
| 7,727,862 B2 * | 6/2010 | Jobetto .............. | H01L 23/3675 438/464 |
| 8,531,012 B2 * | 9/2013 | Lee ........................ | H01L 25/50 257/660 |
| 8,922,005 B2 | 12/2014 | Hu et al. | |

(Continued)

FOREIGN PATENT DOCUMENTS

| | | |
|---|---|---|
| KR | 10-1190920 B1 | 10/2012 |
| KR | 10-1550496 B1 | 9/2015 |

(Continued)

*Primary Examiner* — Daniel Luke
(74) *Attorney, Agent, or Firm* — Lee IP Law, PC

(57) ABSTRACT

A method of fabricating a semiconductor package may include forming a lower redistribution layer, forming a stack on a portion of the lower redistribution layer, and stacking a semiconductor chip on a top surface of the lower redistribution layer. The forming of the stack may include coating a photo imagable dielectric material to form a first insulating layer on the top surface of the lower redistribution layer, forming a first via to penetrate the first insulating layer, coating a photo imagable dielectric material to form a second insulating layer on a top surface of the first insulating layer, and forming a second via to penetrate the second insulating layer.

16 Claims, 20 Drawing Sheets

(51) Int. Cl.
    *H01L 25/10*     (2006.01)
    *H01L 23/00*     (2006.01)

(52) U.S. Cl.
    CPC ............ *H01L 2225/1041* (2013.01); *H01L 2225/1058* (2013.01); *H01L 2924/15153* (2013.01)

(56) References Cited

U.S. PATENT DOCUMENTS

| | | |
|---|---|---|
| 9,385,056 B2 | 7/2016 | Hu et al. |
| 9,417,285 B2 | 8/2016 | Wang et al. |
| 9,576,917 B1 | 2/2017 | Huemoeller et al. |
| 9,601,463 B2 | 3/2017 | Yu et al. |
| 9,865,525 B2 | 1/2018 | Lin et al. |
| 9,953,959 B1 | 4/2018 | Darmawikarta et al. |
| 9,991,206 B1 | 6/2018 | Chang et al. |
| 9,991,219 B2 | 6/2018 | Seol et al. |
| 9,991,239 B2 | 6/2018 | Nair et al. |
| 10,720,392 B2 * | 7/2020 | Aoki ............... H01L 21/486 |
| 2010/0327419 A1 | 12/2010 | Muthukumar et al. |
| 2016/0218093 A1 | 7/2016 | Mortensen et al. |
| 2017/0194300 A1 * | 7/2017 | Lin ............... H01L 21/6835 |
| 2017/0287839 A1 | 10/2017 | Lee et al. |
| 2018/0130782 A1 | 5/2018 | Lee |
| 2019/0164912 A1 | 5/2019 | Lee et al. |
| 2020/0105663 A1 | 4/2020 | Tsai et al. |

FOREIGN PATENT DOCUMENTS

| | | |
|---|---|---|
| KR | 10-2015-0121490 A | 10/2015 |
| KR | 10-2015-0121759 A | 10/2015 |

\* cited by examiner

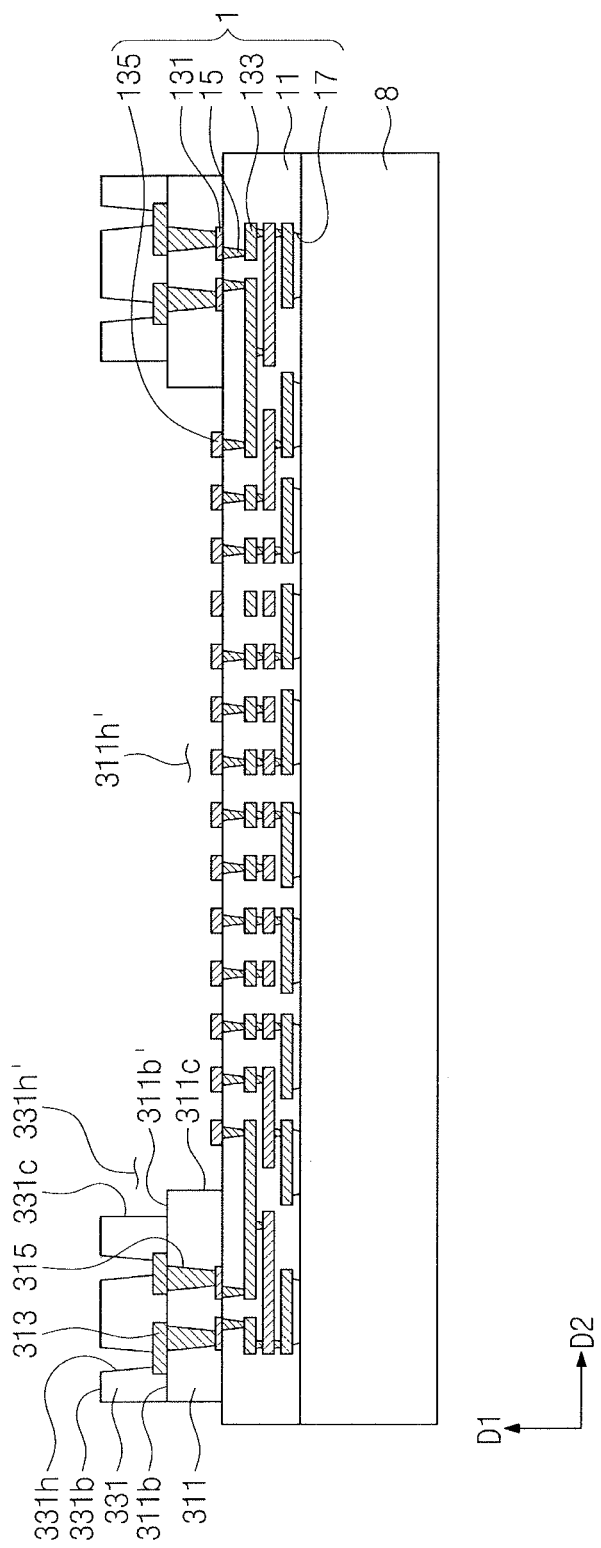

SEMICONDUCTOR PACKAGE, METHOD OF FABRICATING SEMICONDUCTOR PACKAGE, AND METHOD OF FABRICATING REDISTRIBUTION STRUCTURE

CROSS-REFERENCE TO RELATED APPLICATION

Korean Patent Application No. 10-2018-0119089, filed on Oct. 5, 2018, in the Korean Intellectual Property Office, and entitled: "Semiconductor Package, Method of Fabricating Semiconductor Package, and Method of Fabricating Re-Distribution Structure," is incorporated by reference herein in its entirety.

BACKGROUND

1. Field

Embodiments relate to a semiconductor package, and in particular, to a semiconductor package including a redistribution layer.

2. Description of the Related Art

An integrated circuit (IC) chip can be easily used as a part of an electronic product when it is provided in the form of a semiconductor package. A semiconductor package may include a printed circuit board (PCB) and a semiconductor chip, which is mounted on the PCB and is electrically connected to the PCB by bonding wires or bumps.

SUMMARY

Embodiments are directed to a semiconductor package, including a lower redistribution layer, a stack on a first region of a top surface of the lower redistribution layer, and a semiconductor chip on a second region of the top surface of the lower redistribution layer. The stack may include a first insulating layer on the top surface of the lower redistribution layer, a second insulating layer on a top surface of the first insulating layer, a first via penetrating the first insulating layer; and a second via penetrating the second insulating layer, and the second via has a vertically extending central axis that is spaced apart from a vertically extending central axis of the first via.

Embodiments are also directed to a method of fabricating a redistribution structure, including forming a lower redistribution layer and forming a stack on the lower redistribution layer. The forming of the stack may include forming a first insulating layer on a top surface of the lower redistribution layer, forming a first via to penetrate the first insulating layer, forming a second insulating layer on a top surface of the first insulating layer, and forming a second via to penetrate the second insulating layer.

Embodiments are also directed to a method of fabricating a semiconductor package, including forming a lower redistribution layer, forming a stack on a portion of the lower redistribution layer, and stacking a semiconductor chip on a top surface of the lower redistribution layer. The forming of the stack may include coating a photo imagable dielectric material to form a first insulating layer on the top surface of the lower redistribution layer, forming a first via to penetrate the first insulating layer, coating a photo imagable dielectric material to form a second insulating layer on a top surface of the first insulating layer, and forming a second via to penetrate the second insulating layer.

BRIEF DESCRIPTION OF THE DRAWINGS

Features will become apparent to those of skill in the art by describing in detail example embodiments with reference to the attached drawings in which:

FIGS. 4A to 4I illustrate sectional views of a step of forming a stack, according to the flow chart of FIG. 1.

DETAILED DESCRIPTION

Figure 1:
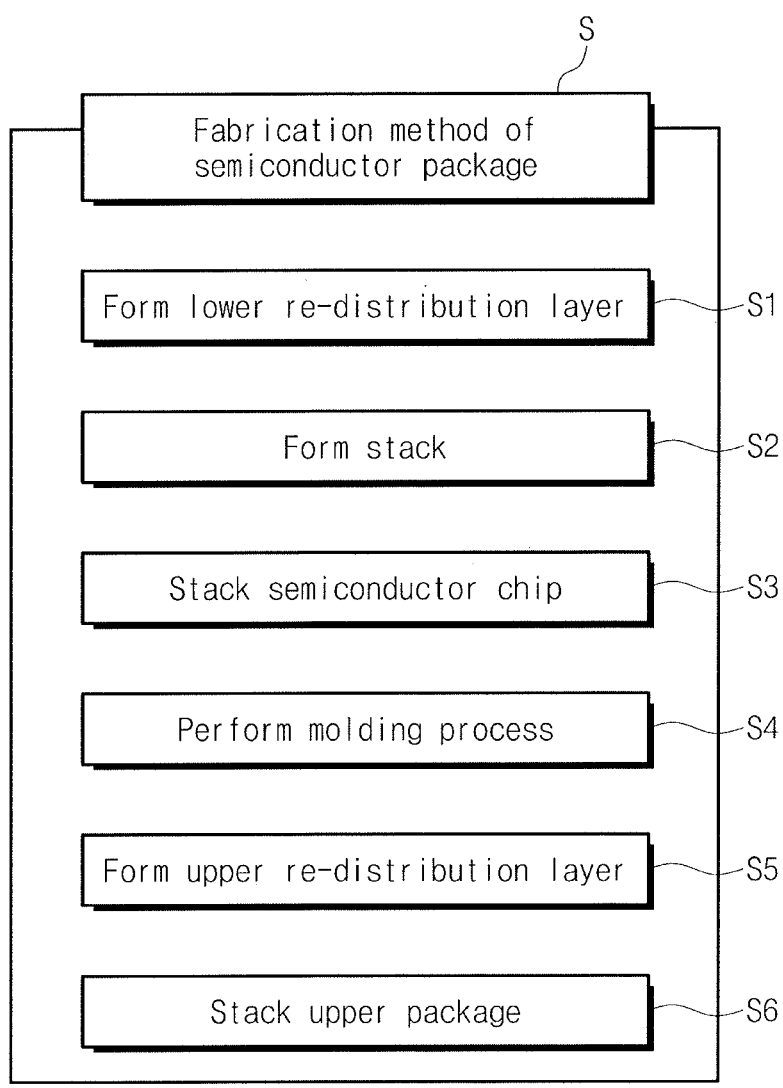
FIG. 1 illustrates a flow chart of a method of fabricating a semiconductor package, according to an example embodiment.

FIG. 1 is a flow chart illustrating a method of fabricating a semiconductor package, and FIGS. 2 to 9A are sectional views illustrating a process of fabricating a semiconductor package, according to the flow chart of FIG. 1.

Hereinafter, a direction D1 of FIG. 2 will be referred to as a first or upward direction, and a direction D2 will be referred to as a second or rightward direction.

Referring to FIG. 1, a method S of fabricating a semiconductor package may include forming a lower redistribution layer (in S1), forming a stack (in S2), stacking a semiconductor chip (in S3), performing a molding process (in S4), forming an upper redistribution layer (in S5), and stacking an upper package (in S6).

Figure 2:
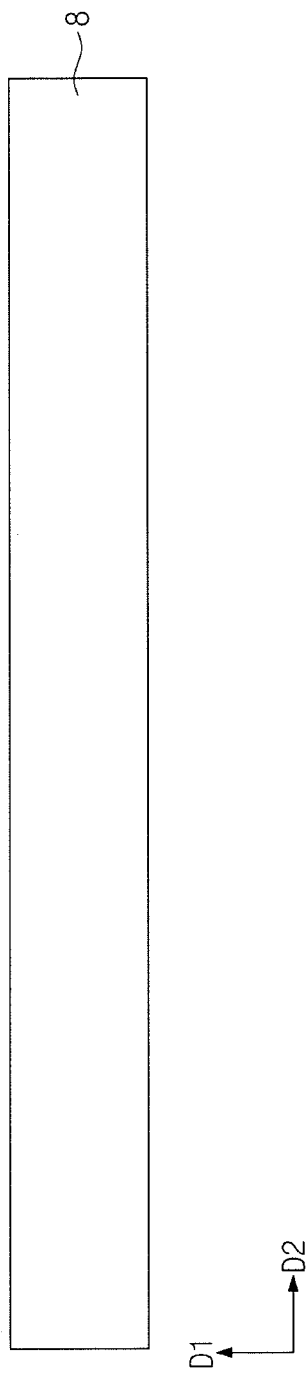
FIG. 2 illustrates a sectional view of a carrier substrate according to an example embodiment.
Figure 3:
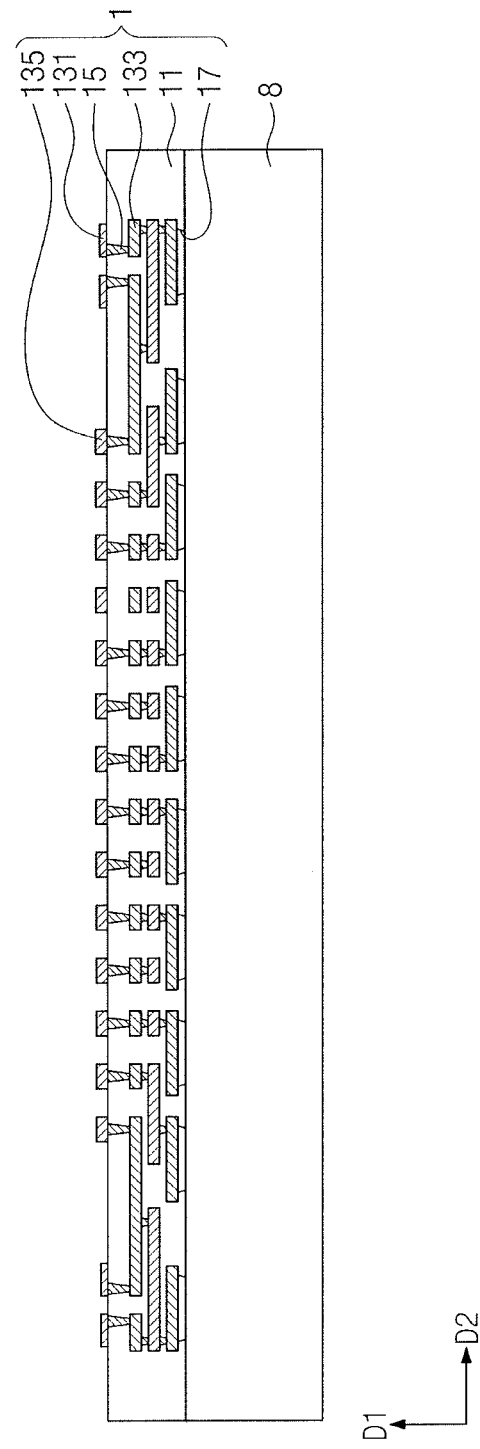
FIG. 3 illustrates a sectional view of a step of forming a lower redistribution layer, according to the flow chart of FIG. 1.

Referring to FIGS. 1 and 2, a carrier substrate 8 may be provided for the forming of the lower redistribution layer (in S1). Referring to FIG. 3, a lower redistribution layer 1 may be formed on a top surface of the carrier substrate 8. In an example embodiment, the lower redistribution layer 1 may be formed by depositing or coating a photosensitive material on the carrier substrate 8, forming holes in the photosensitive material by an exposure and develop process, and filling the holes with a conductive material.

The lower redistribution layer 1 may include a lower redistribution insulator 11, a lower redistribution outer terminal 131, a lower redistribution pattern 133, a lower redistribution connection terminal 135, and a lower redistribution via 15. A lower redistribution hole 17 may be provided in a bottom surface of the lower redistribution insulator 11.

The lower redistribution insulator 11 may include a photo imagable dielectric (PID), that is, a photosensitive material. In an example embodiment, the photosensitive material may be or include a photosensitive polymer. The photosensitive polymer may be or include a photosensitive polyimide (PSPI), a polybenzoxazole (PBO), a phenolic polymer, a benzocyclobutene (BCB) polymer, or a combination thereof, etc.

The lower redistribution insulator 11 may be used as a main body of the lower redistribution layer 1. The lower redistribution insulator 11 may protect the lower redistribution pattern 133. The lower redistribution insulator 11 may be a multi-layered structure.

In an example embodiment, a plurality of the lower redistribution patterns 133 may be provided in the first and second directions D1 and D2. The lower redistribution patterns 133 may be spaced apart from each other in the first direction D1, and may be provided to form a plurality of layers.

The lower redistribution via 15 may be used to electrically connect the lower redistribution patterns 133, which may be spaced apart from each other in the first direction D1, to each other. In the present specification, the expression "electrically connect elements" may mean a direct connection between the elements or an indirect connection between the elements through another conductive element. The lower redistribution via 15 may have an increasing width in a direction toward the first direction D1. In another example embodiment, the width of the lower redistribution via 15 may be constant in the first direction D1 or may vary in various other manners.

The lower redistribution outer terminal 131 may be disposed on a first region of a top surface of the lower redistribution insulator 11. The first region may be an edge region of the top surface of the lower redistribution insulator 11. In an example embodiment, the lower redistribution outer terminal 131 may be a pad. In an example embodiment, a plurality of the lower redistribution outer terminals 131 may be provided. The lower redistribution outer terminal 131 may be used to electrically connect at least one of the lower redistribution patterns 133 to integrated circuits (not shown) of a semiconductor chip 5 (e.g., see FIG. 9A).

The lower redistribution connection terminal 135 may be placed on a second region of the top surface of the lower redistribution insulator 11. The second region may be a center region of the top surface of the lower redistribution insulator 11. For example, the second region may be positioned within a region enclosed by the first region. Thus, the first region may be closer to the side surface of the lower redistribution insulator 11 than the second region. In an example embodiment, the lower redistribution connection terminal 135 may be a pad. In an example embodiment, a plurality of the lower redistribution connection terminals 135 may be provided. The lower redistribution connection terminal 135 may be used to electrically connect at least one of the lower redistribution patterns 133 to a stack 3 (e.g., see FIG. 9A).

Each of the lower redistribution outer terminal 131, the lower redistribution pattern 133, the lower redistribution connection terminal 135, and the lower redistribution via 15 may be formed of or include a conductive material. In an example embodiment, the conductive material may include metallic materials such as copper or aluminum. The lower redistribution hole 17 may be formed in a bottom surface of the lower redistribution layer 1 to have a specific depth in the first direction D1, thereby exposing at least one of the lower redistribution patterns 133.

Figure 4A:
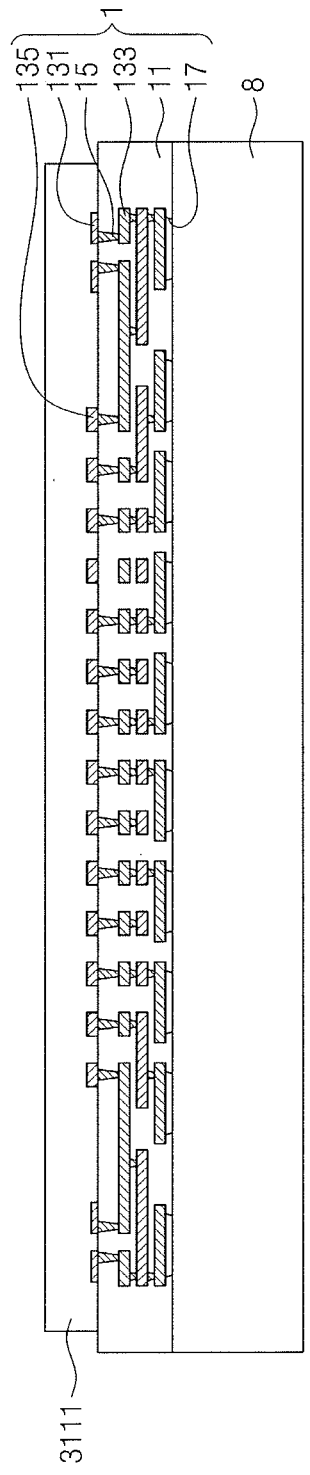

Referring to FIGS. 1 and 4A, the forming of the stack (in S2) may include forming the stack 3 (e.g., see FIG. 9A) on the lower redistribution layer 1. A first preliminary insulating layer 3111 may be formed by depositing or coating a photo imagable dielectric (PID), that is, a photosensitive material, on a top surface of the lower redistribution layer 1. In an example embodiment, the photosensitive material may include a photosensitive polymer. The photosensitive polymer may be or include a photosensitive polyimide (PSPI), a polybenzoxazole (PBO), a phenolic polymer, a benzocyclobutene (BCB) polymer, or a combination thereof, etc. The first preliminary insulating layer 3111 may cover the lower redistribution outer terminal 131 and the lower redistribution connection terminal 135.

Figure 4B:
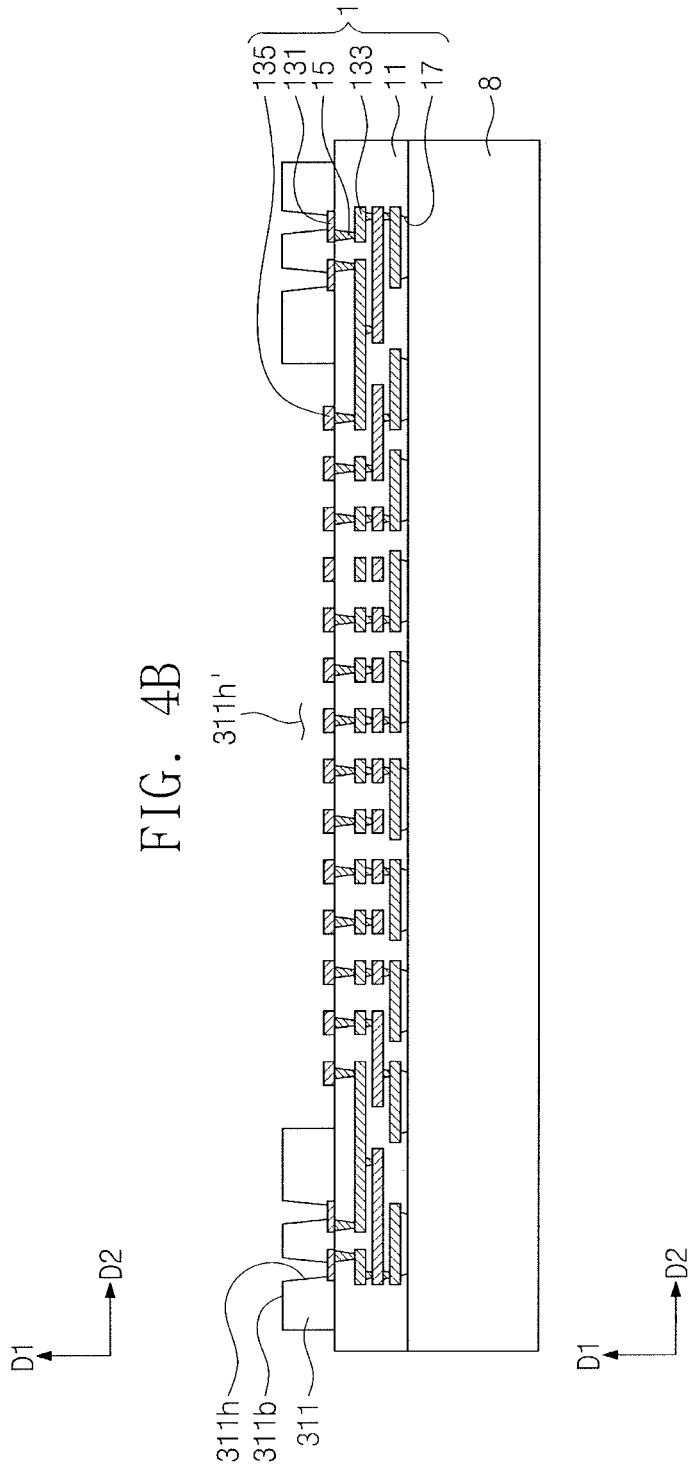

Referring to FIG. 4B, the first preliminary insulating layer 3111 may be patterned through an exposure and develop process. A first insulating layer 311 may be formed by the exposure and develop process on the first preliminary insulating layer 3111. The develop process for forming the first insulating layer 311 may include a positive-tone development (PTD) process or a negative-tone development (NTD) process. In an example embodiment, a bottom surface of the first insulating layer 311 may be in contact with the top surface of the lower redistribution layer 1. In an example embodiment, in the case where the lower redistribution insulator 11 is a multi-layered structure, the first insulating layer 311 may be thicker than one of layers constituting the lower redistribution insulator 11.

As a result of the exposure and develop process, a first via hole 311h may be formed to penetrate at least a portion of the first preliminary insulating layer 3111 from a top surface of the first preliminary insulating layer 3111 to the top surface of the lower redistribution layer 1. For example, the first via hole 311h may be formed to expose the lower redistribution outer terminal 131. In an example embodiment, the first via hole 311h may be formed to have a decreasing or constant width in a direction from a top surface of the first insulating layer 311 toward the lower redistribution layer 1. In an example embodiment, a plurality of the first via holes 311h may be provided. The first via holes 311h may be spaced apart from each other in the second direction D2.

As a result of the exposure and develop process, a first hole 311h' may be formed to penetrate at least a portion of the first preliminary insulating layer 3111 from the top surface of the first preliminary insulating layer 3111 to the top surface of the lower redistribution layer 1. For example, the first hole 311h' may be formed to expose the lower redistribution connection terminal 135. The first hole 311h' may be formed on the first region. Here, the first hole 311h' may refer to as an empty space between first inner side surfaces 311c. A semiconductor chip 5 (e.g., see FIG. 9A) may be placed in the first hole 311h'. This will be described in more detail below.

Figure 4C:
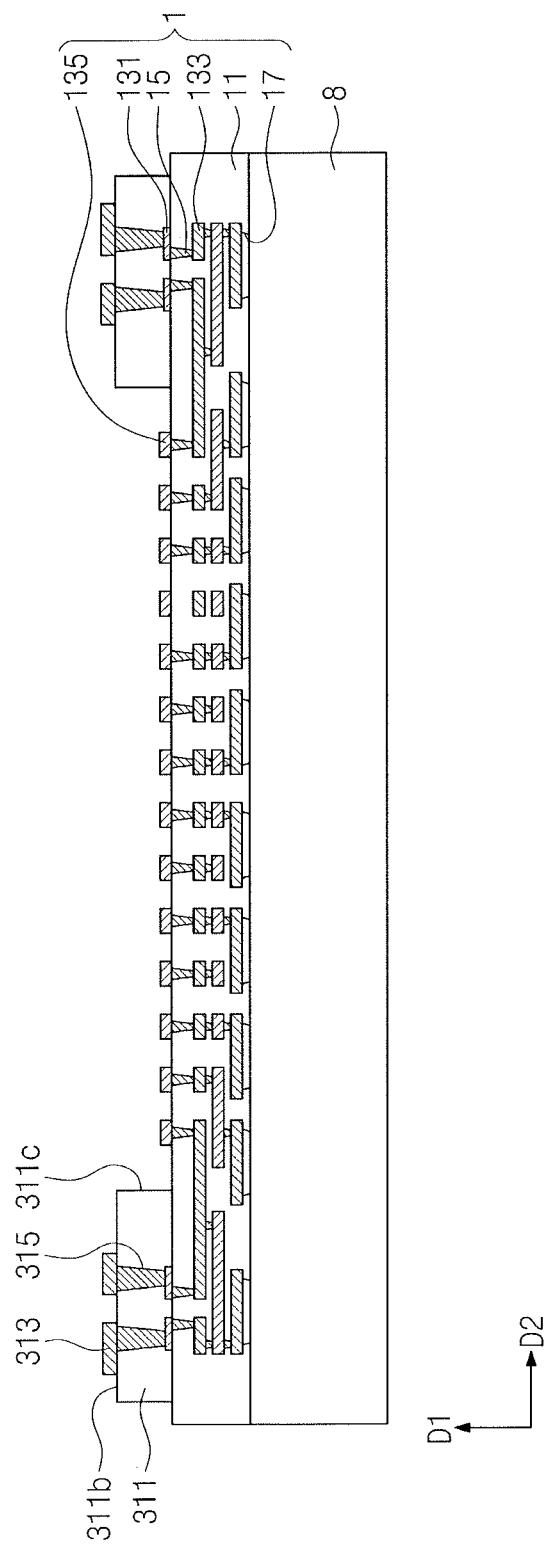

Referring to FIG. 4C, a conductor may be formed in the first via hole 311h of the first insulating layer 311. In an example embodiment, the conductor may be formed by an electroplating process. Hereinafter, the conductor formed in the first via hole 311h will be referred to as a first via 315. A conductor, which will be referred to as a first interconnection line 313, may be formed on a top surface of the first via 315 and a top surface 311b of the first insulating layer 311. The first via 315 and the first interconnection line 313 may be electrically connected to each other. The first via 315 and the first interconnection line 313 may be formed of or include copper, for example. The first via 315 may be electrically connected to the lower redistribution outer terminal 131. For example, the first via 315 may be electrically connected to the lower redistribution pattern 133 through the lower redistribution outer terminal 131. The first via 315 and/or the first insulating layer 311 may be formed to cover all of the top surfaces of the lower redistribution outer terminals 131. Thus, the lower redistribution outer terminals 131 may not be exposed to the outside. Thus, the lower redistribution outer terminals 131 may be prevented from being oxidized during the formation of the stack (in S2). As a result, the reliability of the lower redistribution outer terminal 131 may be improved.

Figure 4D:
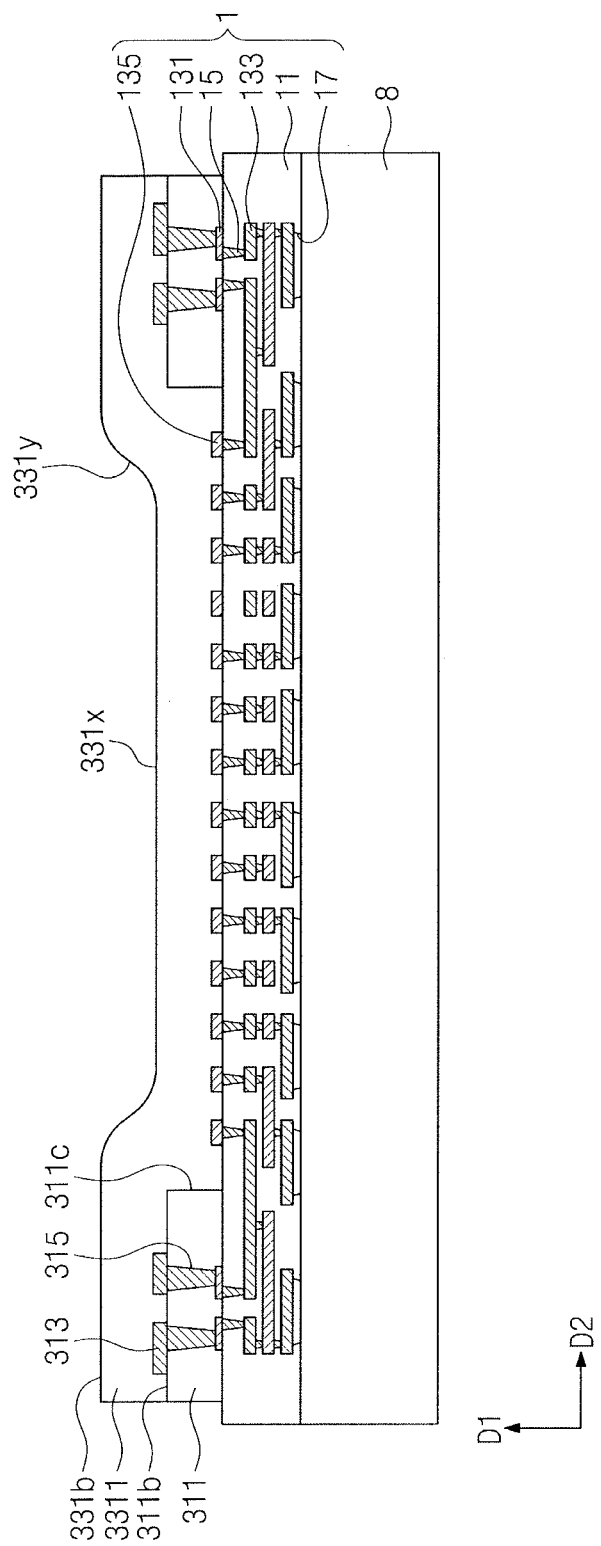

Referring to FIG. 4D, a second preliminary insulating layer 3311 may be formed on the top surface 311*b* of the first insulating layer 311 and the top surface of the lower redistribution layer 1. The second preliminary insulating layer 3311 may be formed of or include a photo imagable dielectric (PID), that is, a photosensitive material. The second preliminary insulating layer 3311 may be formed by a deposition or coating process. In an example embodiment, the photosensitive material may be or include a photosensitive polymer. For example, the photosensitive polymer may be or include a photosensitive polyimide (PSPI), a polybenzoxazole (PBO), a phenolic polymer, a benzocyclobutene (BCB) polymer, or a combination thereof, etc. The second preliminary insulating layer 3311 may be formed to cover the first interconnection line 313 and the lower redistribution connection terminal 135. A first top surface 331*b* of the second preliminary insulating layer 3311 on the first interconnection line 313 may be located at a level higher than a second top surface 331*x* of the second preliminary insulating layer 3311 on the lower redistribution connection terminal 135. The first top surface 331*b* and the second top surface 331*x* may be connected to each other through an inclined surface 331*y*. In an example embodiment, the second preliminary insulating layer 3311 may be formed to cover the structure including the first insulating layer 311, in a substantially uniform thickness.

Referring to FIG. 4E, the second preliminary insulating layer 3311 may be patterned through an exposure and develop process. A second insulating layer 331 may be formed by the exposure and develop process on the second preliminary insulating layer 3311. The develop process for forming the second insulating layer 331 may include a positive-tone development (PTD) process or a negative-tone development (NTD) process.

As a result of the exposure and develop process, a second via hole 331*h* may be formed to penetrate at least a portion of the second preliminary insulating layer 3311 from a top surface of the second preliminary insulating layer 3311 to the top surface of the lower redistribution layer 1 or the top surface 311*b* of the first insulating layer 311. For example, the second via hole 331*h* may be formed to expose the first interconnection line 313. In an example embodiment, the second via hole 331*h* may be formed to have a decreasing or constant width in a direction from a top surface of the second insulating layer 331 toward the first insulating layer 311. In an example embodiment, a plurality of the second via holes 331*h* may be provided. The second via holes 331*h* may be spaced apart from each other in the second direction D2.

As a result of the exposure and develop process, at least a portion of the second preliminary insulating layer 3311 may be recessed from a top surface of the second preliminary insulating layer 3311 to the top surface of the lower redistribution layer 1 to expose the lower redistribution connection terminal 135. For example, at least a portion of the second preliminary insulating layer 3311 may be removed from the first hole 311*h*' to again expose the lower redistribution connection terminal 135. Furthermore, as a result of the exposure and develop process, a second hole 331*h*' may be formed on the first hole 311*h*'. The second hole 331*h*' may refer to as an empty space between second inner side surfaces 331*c*. The second hole 331*h*' and the first hole 311*h*' may be connected to form a single empty space. A semiconductor chip 5 (e.g., see FIG. 9A) may be placed in the first hole 311*h*'. This will be described in more detail below. The second preliminary insulating layer 3311 may be patterned through an exposure and develop process to form the second insulating layer 331. The develop process for forming the second insulating layer 331 may include a positive-tone development (PTD) process or a negative-tone development (NTD) process.

The first insulating layer 311 and the second insulating layer 331 may form a staircase structure in a direction toward the lower redistribution connection terminal 135. Thus, the first inner side surface 311*c* of the first insulating layer 311 may not be aligned to the second inner side surface 331*c* of the second insulating layer 331, when viewed in a plan view. The first inner side surface 311*c* may be located inside the second inner side surface 331*c*. Thus, the first inner side surface 311*c* may be closer to the lower redistribution connection terminal 135 than the second inner side surface 331*c*, when viewed in a plan view. An area of a second top surface 331*b* of the second insulating layer 331 may be smaller than an area of the first top surface 311*b* of the first insulating layer 311. In an example embodiment, the second insulating layer 331 may be formed on the first insulating layer 311 to expose a portion 311*b*' of the first insulating layer 311. The exposed portion 311*b*' may be adjacent to the first inner side surface 311*c*.

Figure 4F:
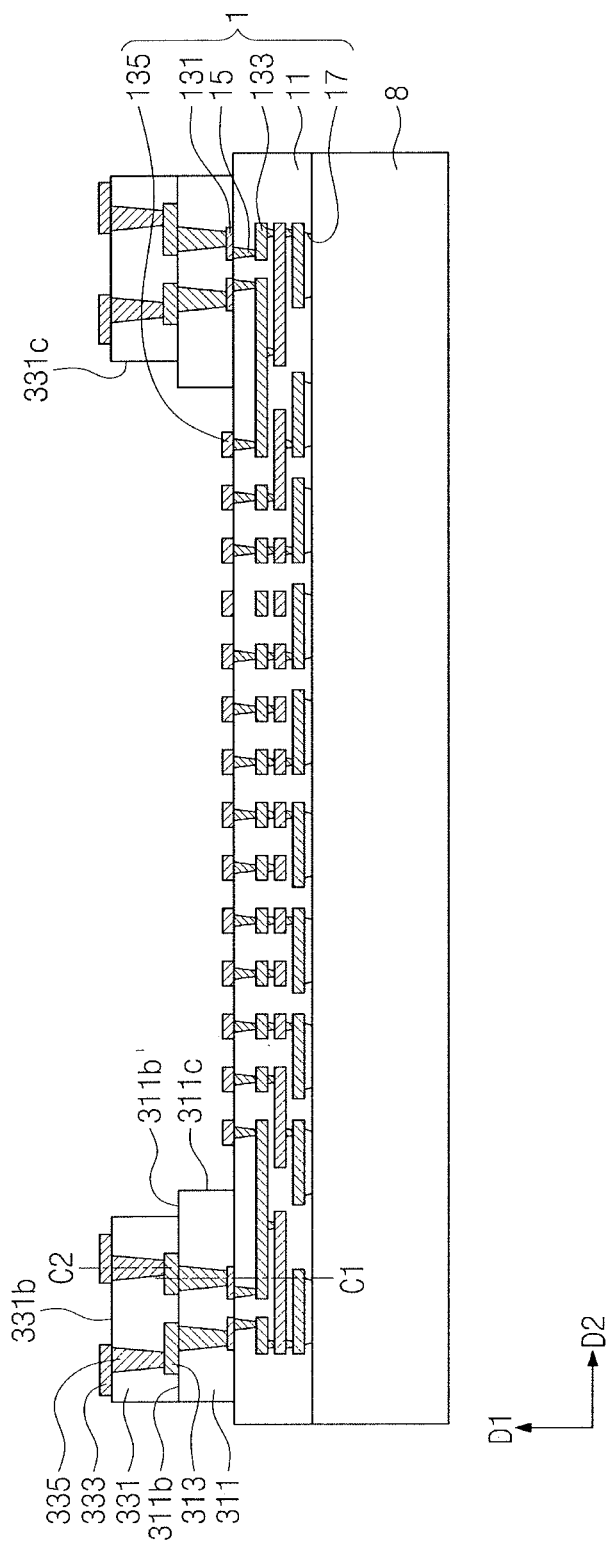

Referring to FIG. 4F, a conductor may be formed in the second via hole 331*h* of the second insulating layer 331. In an example embodiment, the conductor may be formed by an electroplating process. Hereinafter, the conductor formed in the second via hole 331*h* will be referred to as a second via 335. The conductor that is provided on the top surface of the second via 335 and the top surface 331*b* of the second insulating layer 331 will be referred to as a second interconnection line 333. The second via 335 and the second interconnection line 333 may be electrically connected to each other. The second via 335 and the second interconnection line 333 may be formed of or include copper, for example. The second via 335 may be electrically connected to the first interconnection line 313. For example, the second via 335 may be electrically connected to the first via 315 through the first interconnection line 313.

In an example embodiment, the first via 315 and the second via 335 may be off-centered from each other, when viewed in a plan view. For example, a vertically extending central axis C1 of the first via 315 may be spaced apart from a vertically extending central axis C2 of the second via 335. The first via 315 and the second via 335, which are off-centered from each other, may be connected to each other by the first interconnection line 313. By accommodating the off-centered arrangement between the first via 315 and the second via 335, it may be possible to reduce technical restrictions in disposing the lower redistribution patterns 133 of the lower redistribution layer 1.

Figure 4G:
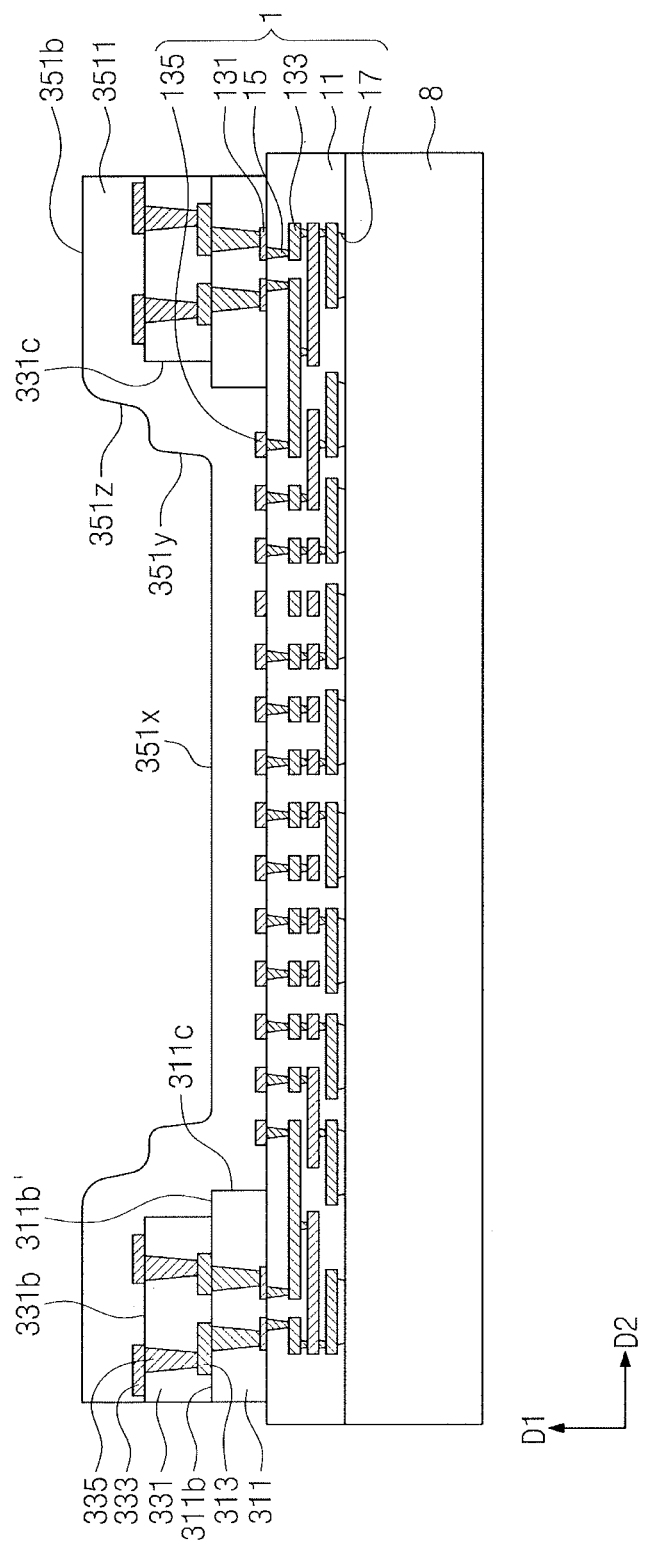

Referring to FIG. 4G, a third preliminary insulating layer 3511 may be formed on the top surface 331*b* of the second insulating layer 331 and the top surface of the lower redistribution layer 1. The third preliminary insulating layer 3511 may be formed of or include a photo imagable dielectric (PID), that is, a photosensitive material. The third preliminary insulating layer 3511 may be formed by a deposition or coating process. In an example embodiment, the photosensitive material may include a photosensitive polymer. For example, the photosensitive polymer may be or include a photosensitive polyimide (PSPI), a polybenzoxazole (PBO), a phenolic polymer, a benzocyclobutene (BCB) polymer, or a combination thereof, etc. The third preliminary insulating layer 3511 may cover the second interconnection line 333 and the lower redistribution connection terminal 135. A first top surface 351b of the third preliminary insulating layer 3511 on the second interconnection line 333 may be located at a level higher than a second top surface 351x of the third preliminary insulating layer 3511 on the lower redistribution connection terminal 135. The first top surface 351b and the second top surface 351x may be connected to each other through two inclined surfaces 351y and 351z. The first insulating layer 311 and the second insulating layer 331 may form the staircase structure. Thus, it may be possible to prevent an abrupt variation in height difference of an underlying structure when the third preliminary insulating layer 3511 is formed. Thus, the third preliminary insulating layer 3511 may be formed to have a substantially uniform thickness.

Figure 4H:
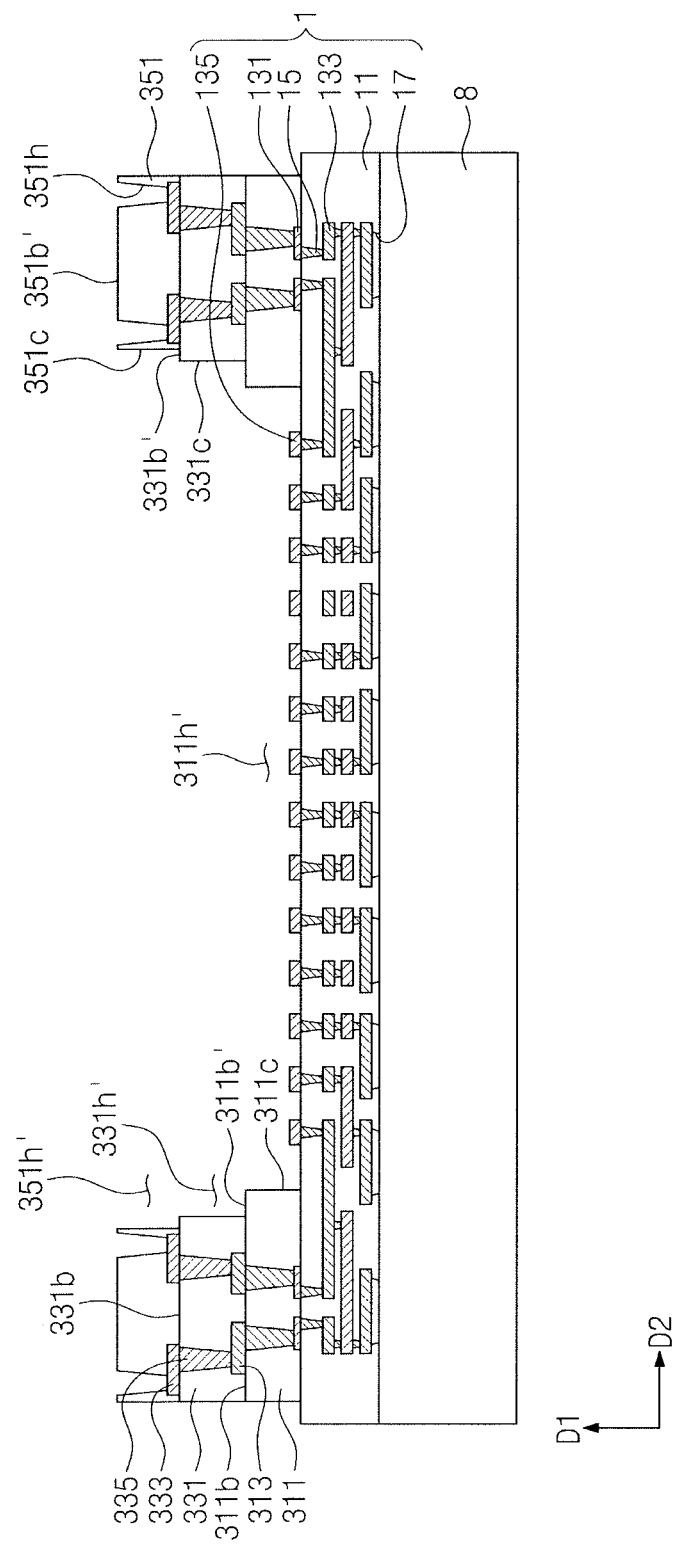

Referring to FIG. 4H, the third preliminary insulating layer 3511 may be patterned through an exposure and develop process to form a third insulating layer 351. The develop process for forming the third insulating layer 351 may include a positive-tone development (PTD) process or a negative-tone development (NTD) process.

As a result of the exposure and develop process, at least a portion of the third preliminary insulating layer 3511 may be recessed from a top surface of the third preliminary insulating layer 3511 to the top surface of the lower redistribution layer 1 or to the top surface 331b of the second insulating layer 331 to expose the lower redistribution connection terminal 135 and the second interconnection line 333. For example, a third via hole 351h may be formed to expose the second interconnection line 333. In an example embodiment, the third via hole 351h may be formed to have a decreasing or constant width in a direction from a top surface of the third insulating layer 351 toward the second insulating layer 331. In an example embodiment, a plurality of the third via holes 351h may be provided. The third via holes 351h may be spaced apart from each other in the second direction D2.

As a result of the exposure and develop process, at least a portion of the third preliminary insulating layer 3511 may be recessed from a top surface of the third preliminary insulating layer 3511 to the top surface of the lower redistribution layer 1 to expose the lower redistribution connection terminal 135. For example, at least a portion of the third preliminary insulating layer 3511 may be removed from the first hole 311h' and the second hole 331h' to again expose the lower redistribution connection terminal 135. Furthermore, a third hole 351h' may be formed on the second hole 331h'. The third hole 351h' may refer to as an empty space between third inner side surfaces 351c. The third hole 351h" may be connected to the first hole 311h' and the second hole 331h' to form a single empty space. A semiconductor chip 5 (e.g., see FIG. 9A) may be placed in the first hole 311h'. This will be described in more detail below. The third preliminary insulating layer 3511 may be patterned by an exposure and develop process to form the third insulating layer 351. The develop process for forming the third insulating layer 351 may include a positive-tone development (PTD) process or a negative-tone development (NTD) process.

The second insulating layer 331 and the third insulating layer 351 may form a staircase structure in a direction toward the lower redistribution connection terminal 135. Thus, the second inner side surface 331c of the second insulating layer 331 may not be aligned from the third inner side surface 351c of the third insulating layer 351, when viewed in a plan view. The second inner side surface 331c may be located inside the third inner side surface 351c. Thus, the second inner side surface 331c may be closer to the lower redistribution connection terminal 135 than the third inner side surface 351c, when viewed in a plan view. An area of a third top surface 351b' of the third insulating layer 351 may be smaller than the area of the second top surface 331b of the second insulating layer 331. In an example embodiment, the third insulating layer 351 may be formed on the second insulating layer 331 to expose a portion 331b' of the second top surface 331b of the second insulating layer 331. The exposed portion 331b' may be adjacent to the second inner side surface 331c.

Figure 4I:
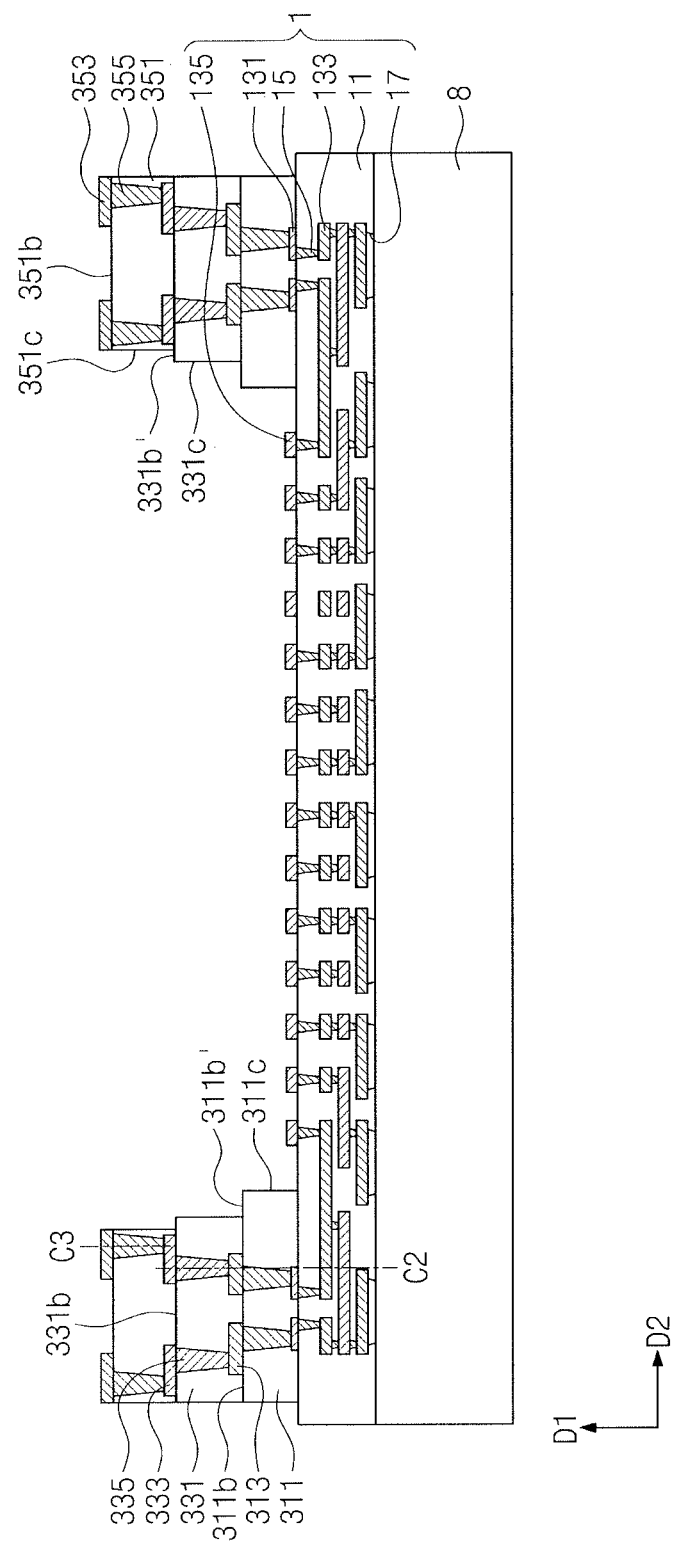

Referring to FIG. 4I, a conductor may be formed in the third via hole 351h of the third insulating layer 351. In an example embodiment, the conductor may be formed by an electroplating process. The conductor formed in the third via hole 351h will be referred to as a third via 355. The conductor, which is formed on a top surface of the third via 355 and the third top surface 351b of the third insulating layer 351, will be referred to as an upper terminal 353. The third via 355 and the upper terminal 353 may be electrically connected to each other. The third via 355 and the upper terminal 353 may be formed of or include copper, for example. The third via 355 may be electrically connected to the second interconnection line 333. For example, the third via 355 may be electrically connected to the second via 335 through the second interconnection line 333.

In an example embodiment, the second via 335 and the third via 355 may be off-centered from each other, when viewed in a plan view. For example, the vertically extending central axis C2 of the second via 335 may be spaced apart from a vertically extending central axis C3 of the third via 355, when viewed in a plan view. The second via 335 and the third via 355, which are off-centered from each other, may be connected to each other by the second interconnection line 333. By accommodating the off-centered arrangement between the second via 335 and the third via 355, it may be possible to reduce technical restrictions in disposing the lower redistribution pattern 133 of the lower redistribution layer 1 and/or terminals of an upper package 9 (e.g., see FIG. 9A).

An example of the stack 3 including the first to third insulating layers 311, 331, and 351 and the first to third vias 315, 335, and 355 has been described above. In another example embodiment, the stack 3 may be configured to include one insulating layer and one via layer. In another example embodiment, the stack 3 may be configured to include two insulating layers and two via layers or to include four or more insulating layers and four or more via layers. The stack 3 provided on the lower redistribution layer 1 may be referred to as a redistribution structure.

Figure 5:
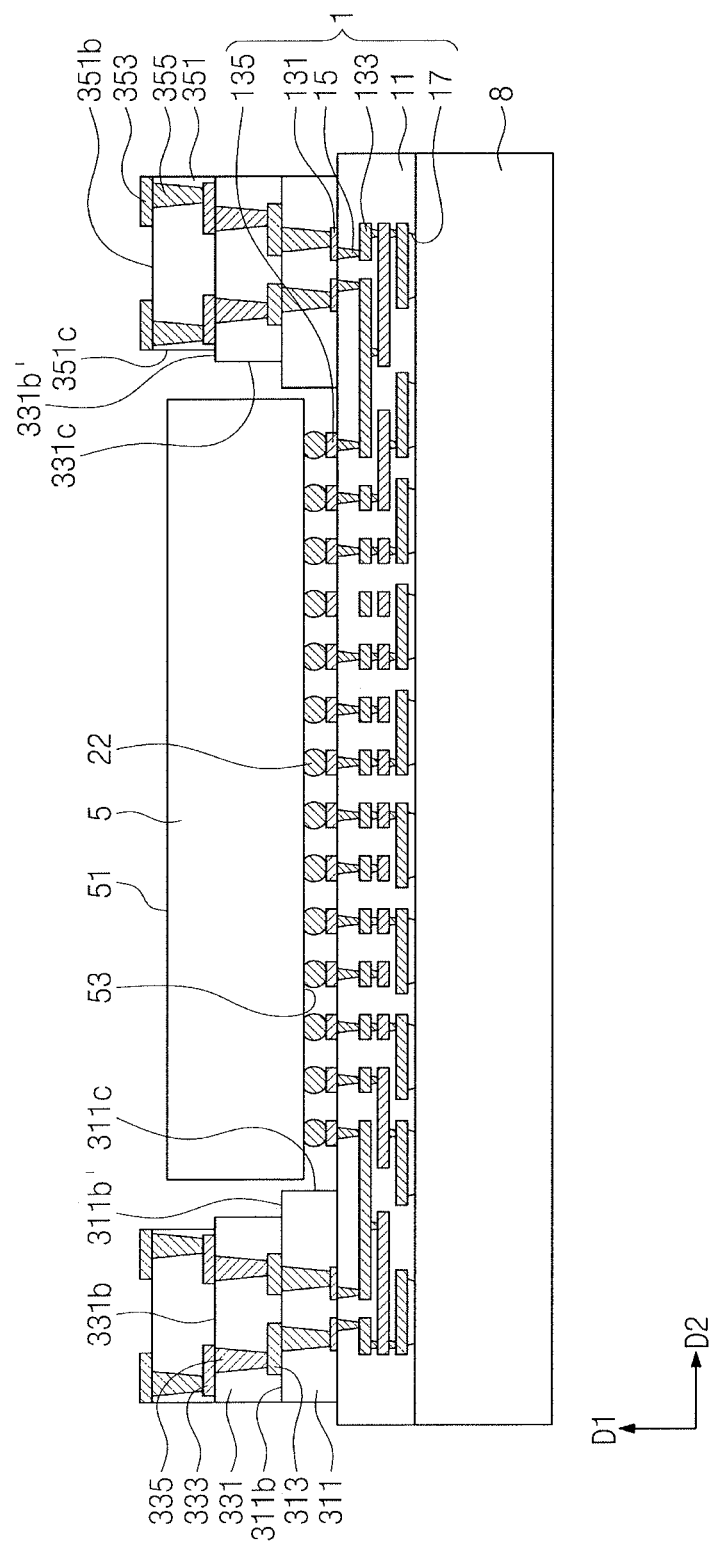
FIG. 5 illustrates a sectional view of a step of stacking a semiconductor chip, according to the flow chart of FIG. 1.

Referring to FIGS. 1 and 5, the stacking of the semiconductor chip (in S3) may include stacking a semiconductor chip 5 on a top surface of the lower redistribution layer 1. The semiconductor chip 5 may include at least one of a memory chip, a logic chip, or combination thereof. The semiconductor chip 5 may be electrically connected to the lower redistribution connection terminal 135 of the lower redistribution layer 1 via an intermediate ball 22. Thus, the semiconductor chip 5 may be electrically connected to the lower redistribution pattern 133. The semiconductor chip 5 may be provided in such a way that a bottom surface 53 thereof faces the top surface of the lower redistribution layer 1. The intermediate ball 22 may be a solder ball, for example.

When the semiconductor chip 5 is stacked on the top surface of the lower redistribution layer 1 with the intermediate ball 22 interposed therebetween, the bonding process may be performed. The bonding process may be a reflow process or a thermo-compression process, for example. The intermediate ball 22 and the lower redistribution connection terminal 135 may be bonded to each other by the bonding process.

In an example embodiment, the top surface 51 of the semiconductor chip 5 may be located at a level lower than the third top surface 351b of the third insulating layer 351. The semiconductor chip 5 may be placed in an empty space defined by the stack 3. For example, the semiconductor chip 5 may be placed in such a way that a side surface thereof faces the first inner side surface 311c, the second inner side surface 331c, and/or the third inner side surface 351c.

Figure 6:
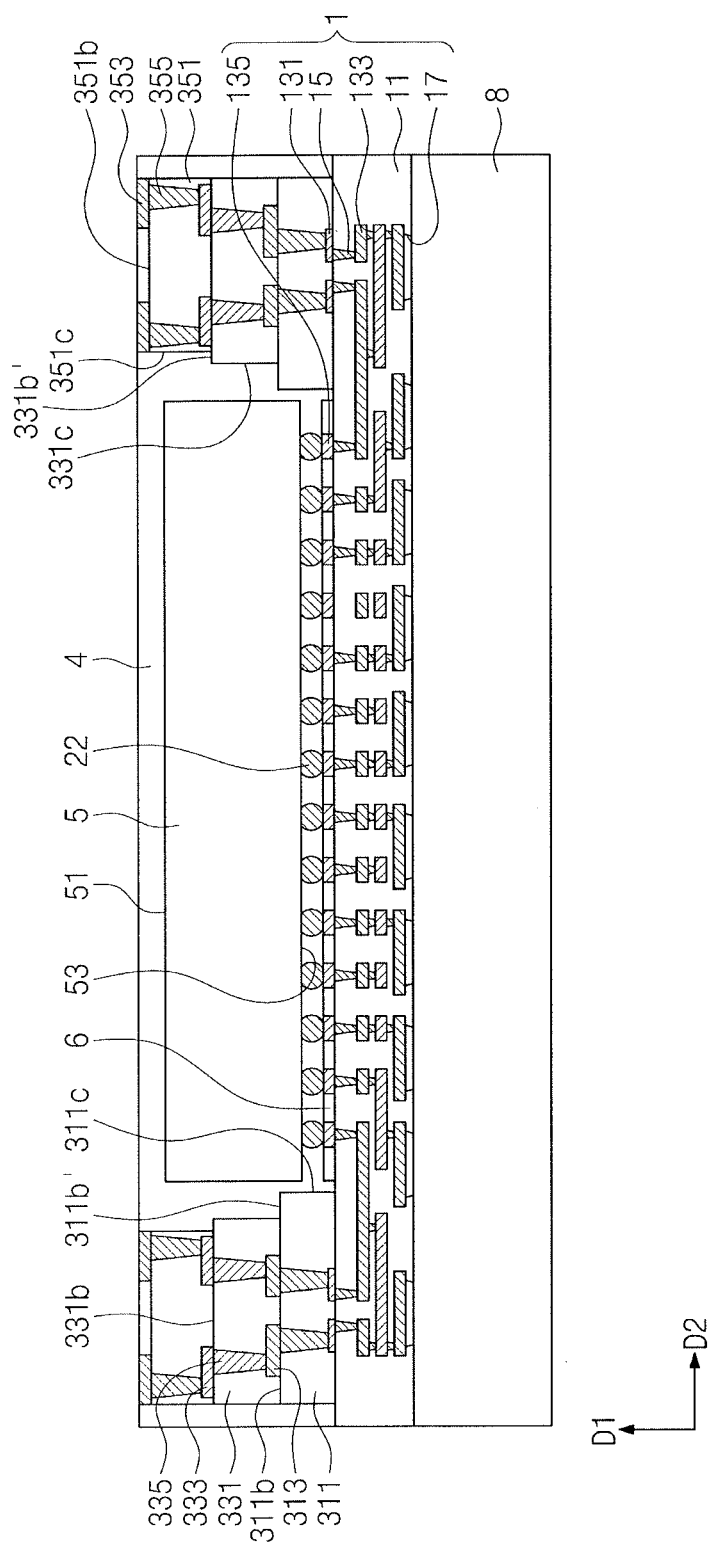
FIG. 6 illustrates a sectional view of a molding step, according to the flow chart of FIG. 1.

Referring to FIGS. 1 and 6, the molding process (in S4) may include forming a mold layer 4 to cover at least one of surfaces of the semiconductor chip 5. The mold layer 4 may protect the semiconductor chip 5 from external attack. Owing to the mold layer 4, the semiconductor chip 5 may be protected from external heat, moisture, and/or impact. The mold layer 4 may be configured to exhaust heat, which is generated from the semiconductor chip 5, the lower redistribution layer 1, and/or the stack 3, to the outside. In an example embodiment, the mold layer 4 may cover a top surface 51 of the semiconductor chip 5. In an example embodiment, the mold layer 4 may cover an outer side surface (not shown) of the stack 3. The mold layer 4 may be provided to fill a gap region between the side surface of the semiconductor chip 5 and the first inner side surface 311c, the second inner side surface 331c, and/or the third inner side surface 351c of the stack 3. An under fill 6 may be further provided around the lower redistribution connection terminal 135. In an example embodiment, the mold layer 4 may be formed of or include an epoxy molding compound (EMC) material. The molding process may include placing the lower redistribution layer 1, on which the semiconductor chip 5 and the stack 3 are stacked, in a mold and then injecting a material for the mold layer 4 into the mold. In an example embodiment, the mold layer 4 may include an Ajinomoto build-up film (ABF). In another example embodiment, another insulator may be used for the mold layer 4.

Figure 7:
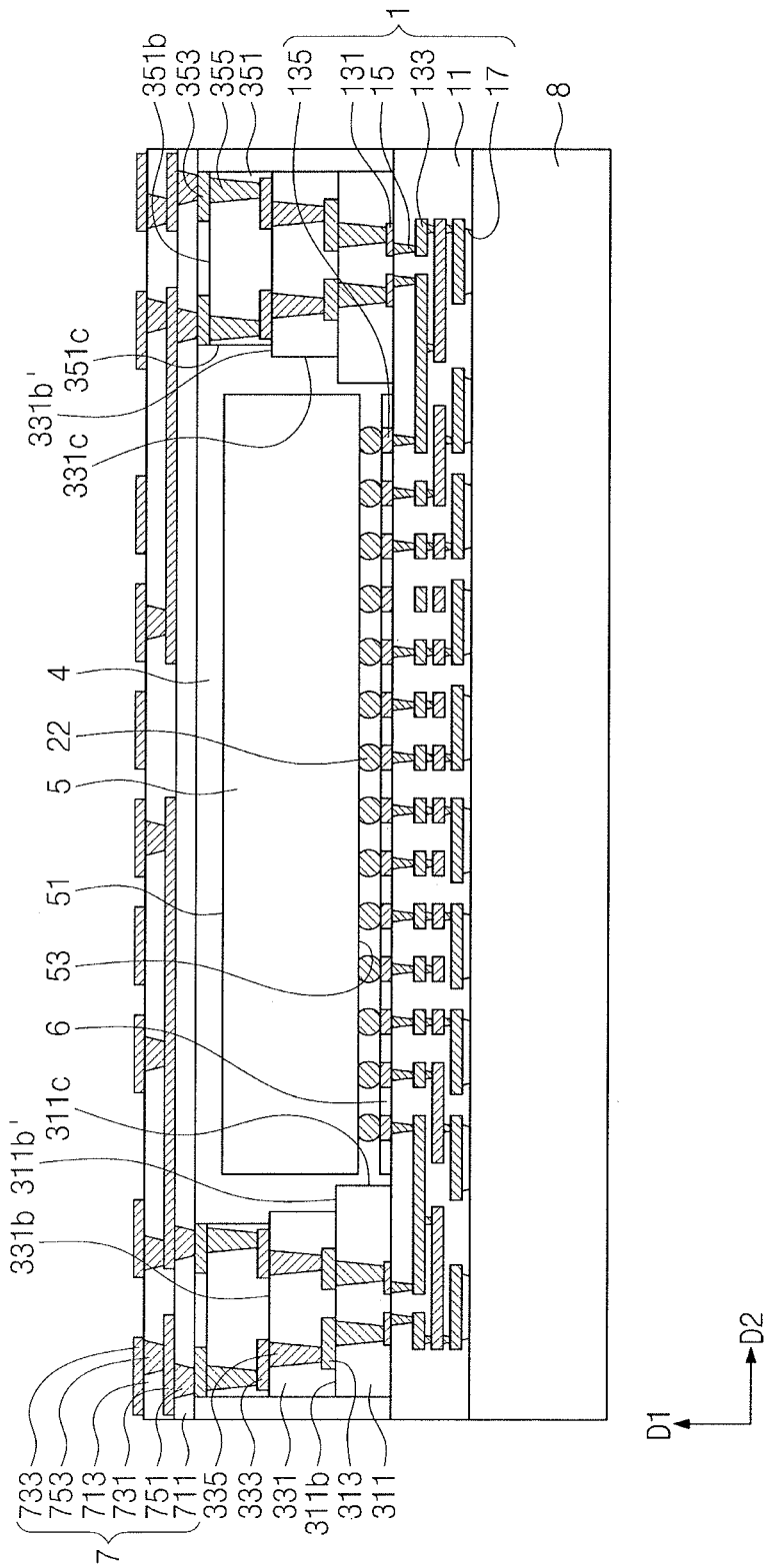
FIG. 7 illustrates a sectional view of a step of forming an upper redistribution layer, according to the flow chart of FIG. 1.

Referring to FIGS. 1 and 7, the forming of the upper redistribution layer (in S5) may include forming an upper redistribution layer 7 on the top surface of the mold layer 4 and/or on a top portion of the stack 3, after the molding process. In an example embodiment, the upper redistribution layer 7 may be formed by depositing or coating a photosensitive material on the top surface of the mold layer 4 and/or the top portion of the stack 3, forming holes in the photosensitive material by an exposure and develop process, and filling the holes with a conductive material. The upper redistribution layer 7 may include a first upper redistribution insulating layer 711, a second upper redistribution insulating layer 713, an upper redistribution pattern 731, a first upper redistribution via 751, a second upper redistribution via 753, and an upper redistribution terminal 733.

The first upper redistribution insulating layer 711 may be provided on the mold layer 4 and the stack 3. The second upper redistribution insulating layer 713 may be provided on the first upper redistribution insulating layer 711. The first upper redistribution insulating layer 711 and the second upper redistribution insulating layer 713 may include a photo imagable dielectric (PID), that is, a photosensitive material. The first upper redistribution insulating layer 711 and the second upper redistribution insulating layer 713 may protect the upper redistribution pattern 731, the first upper redistribution via 751, and the second upper redistribution via 753.

The first upper redistribution via 751 may be provided to penetrate the first upper redistribution insulating layer 711. In an example embodiment, a plurality of the first upper redistribution vias 751 may be arranged in the second direction D2. At least one of the first upper redistribution vias 751 may be electrically connected to the upper terminal 353.

The upper redistribution pattern 731 may be provided on the first upper redistribution via 751. In an example embodiment, a plurality of the upper redistribution patterns 731 may be provided. At least one of the upper redistribution patterns 731 may extend in the second direction D2. The upper redistribution pattern 731 may be electrically connected to the first upper redistribution via 751.

The second upper redistribution via 753 may be provided to penetrate the second upper redistribution insulating layer 713. In an example embodiment, a plurality of the second upper redistribution vias 753 may be arranged in the second direction D2. The second upper redistribution vias 753 may be electrically connected to the upper redistribution pattern 731.

The upper redistribution terminal 733 may be provided on the second upper redistribution via 753. In an example embodiment, a plurality of the upper redistribution terminals 733 may be provided. The upper redistribution terminal 733 may be electrically connected to the second upper redistribution via 753. In an example embodiment, the upper redistribution terminal 733 may be a pad.

Each of the upper redistribution pattern 731, the first upper redistribution via 751, the second upper redistribution via 753, and the upper redistribution terminal 733 may be formed of or include a conductive material. In an example embodiment, the conductive material may include metallic materials such as copper or aluminum.

By providing the upper redistribution layer 7 on the semiconductor chip 5, terminals of an upper package 9 (e.g., see FIG. 9A) may be freely disposed. Thus, it may be possible to reduce difficulty in designing the upper package 9.

Figure 8:
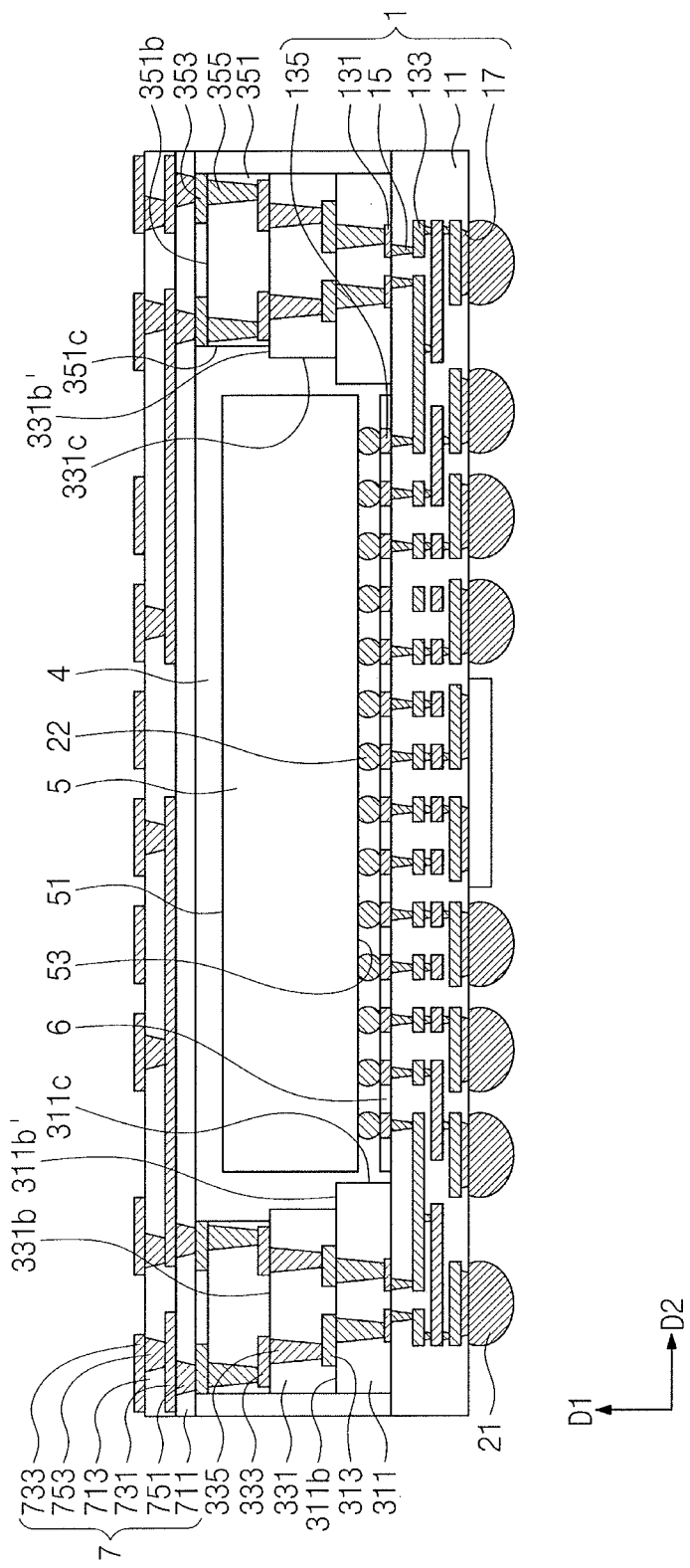
FIG. 8 illustrates a sectional view of a step of removing the first carrier substrate, according to an example embodiment.

Referring to FIG. 8, the carrier substrate 8 may be removed from the bottom surface of the lower redistribution layer 1. After the removal of the carrier substrate 8, lower balls 21 may be formed on the lower redistribution patterns 133 exposed by the lower redistribution hole 17. The lower redistribution patterns 133 may be electrically connected to another package or board through the lower balls 21.

Figure 9A:
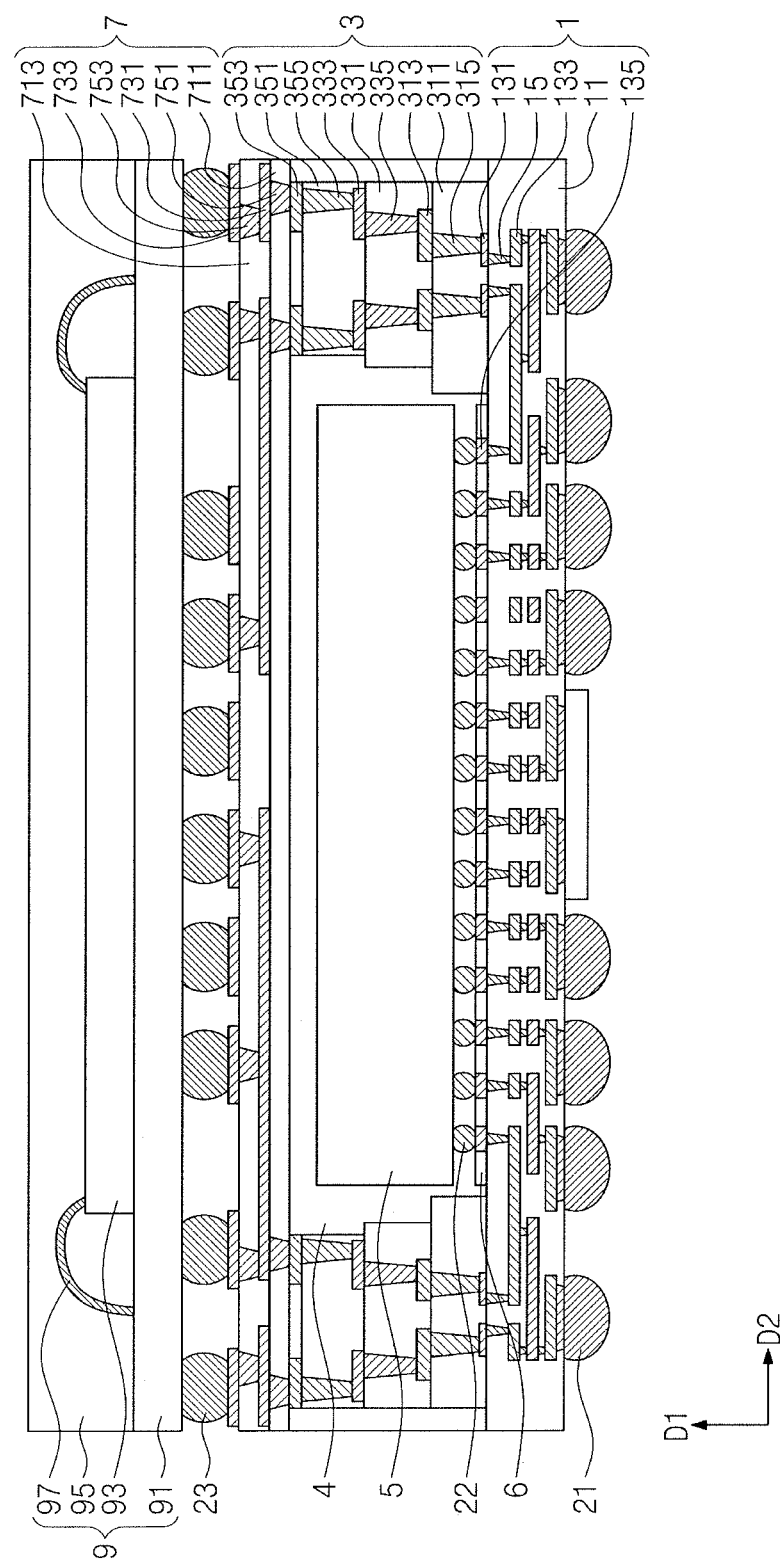
FIG. 9A illustrates a sectional view of a step of stacking an upper package, according to the flow chart of FIG. 1.

Referring to FIGS. 1 and 9A, the stacking of the upper package (in S6) may include stacking the upper package 9 on the upper redistribution layer 7. The upper package 9 may include an upper substrate 91, an upper semiconductor chip 93, an upper mold layer 95, an upper wire 97, and so forth. The upper package 9 and the upper redistribution terminal 733 may be electrically connected to each other through upper balls 23. The upper balls 23 may be solder balls, for example. The upper ball 23 and the upper redistribution terminal 733 may be bonded to each other. The bonding process may be a reflow process or a thermo-compression process, for example. The upper semiconductor chip 93 may be electrically connected to the upper wire 97, the upper substrate 91, and the upper ball 23. Thus, the upper package 9 may be electrically connected to the lower redistribution layer 1 through the upper redistribution layer 7 and the stack 3.

Figure 9B:
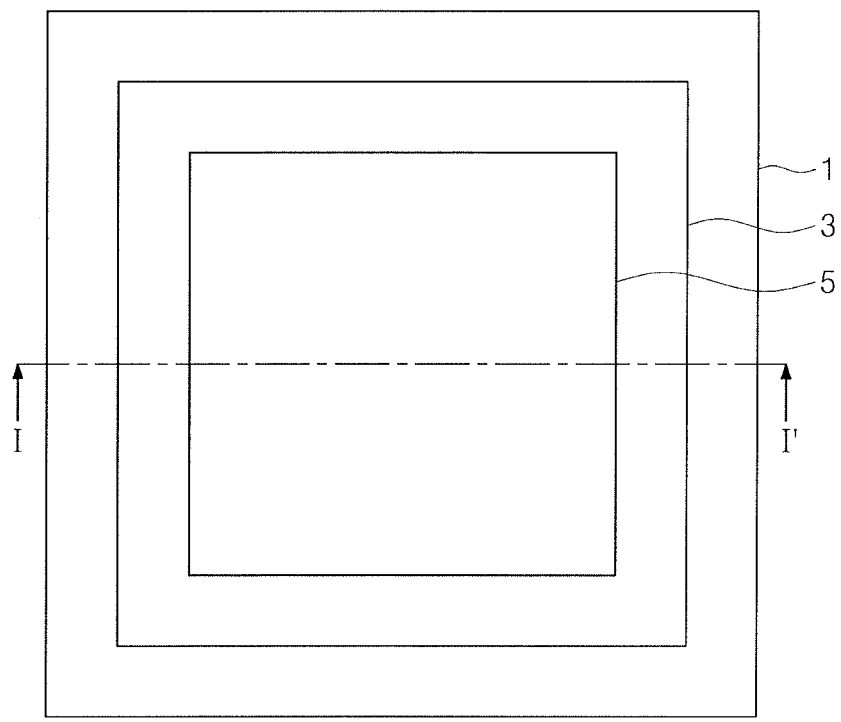
FIG. 9B illustrates a plan view of a semiconductor package according to an example embodiment.

FIG. 9B is a plan view of a semiconductor package according to FIG. 9A. FIG. 9A is a sectional view taken along a line I-I' of FIG. 9B.

Referring to FIG. 9B, the semiconductor package may be configured in such a way that an area of the semiconductor chip 5 is smaller than that of the stack 3, when viewed in a plan view. The semiconductor chip 5 may be located inside the stack 3, when viewed in a plan view. FIG. 9B illustrates an example, in which a boundary of the stack 3 is located outside a boundary of the semiconductor chip 5 in all directions, for example. For example, the boundary of the stack 3 may be located outside the boundary of the semiconductor chip 5 in the second direction D2, but the boundary of the semiconductor chip 5 may coincide with the boundary of the stack 3 in a third direction, which is perpendicular to the first and second directions D1 and D2.

In an example embodiment, an area of the lower redistribution layer 1 may be larger than an area of the stack 3, when viewed in a plan view. In another example embodiment, the area of the stack 3 may be substantially equal to the area of the lower redistribution layer 1.

In a method of fabricating a semiconductor package according to an example embodiment, the lower redistribution layer with the stack may be formed and then the semiconductor chip may be stacked thereon. This may make it possible to use the lower redistribution layer, the stack, and the semiconductor chip, which have been qualified as a good product, for the semiconductor package, and consequently to improve a total production yield of the semiconductor package. Furthermore, the lower redistribution layer with the stack may be formed by an independent process, which may be performed concurrently with the formation of the semiconductor chip. Accordingly, it may be possible to reduce a total process time for fabricating the semiconductor package.

In a semiconductor package according to an example embodiment, deposition, coating, exposure, and/or develop processes may be used to form the stack. Thus, it may be possible to reduce a size of a via hole. This may make it possible to reduce an overall size of the semiconductor package. Furthermore, it may be possible to reduce technical restrictions associated with a height of the stack and with a size of a semiconductor chip allowed for the stack.

In a semiconductor package according to an example embodiment, the vias may be arranged to form various paths in the stack. Thus, it may be possible to reduce technical restrictions in disposing the connection terminals of the lower redistribution layer, the upper redistribution layer, and/or the upper package and in designing an overall structure of the semiconductor package.

In a semiconductor package according to an example embodiment, the upper redistribution layer may allow for reduction in technical restrictions relating to disposing connection terminals of the lower redistribution layer and/or the stack and in designing an overall structure of the semiconductor package.

In a semiconductor package according to an example embodiment, the first insulating layer and the second insulating layer may form a staircase structure. Thus, it may be possible to form the third preliminary insulating layer, which will be used as the third insulating layer, in a substantially uniform thickness. Thus, the third insulating layer may be formed to have a desired property.

Figure 10:
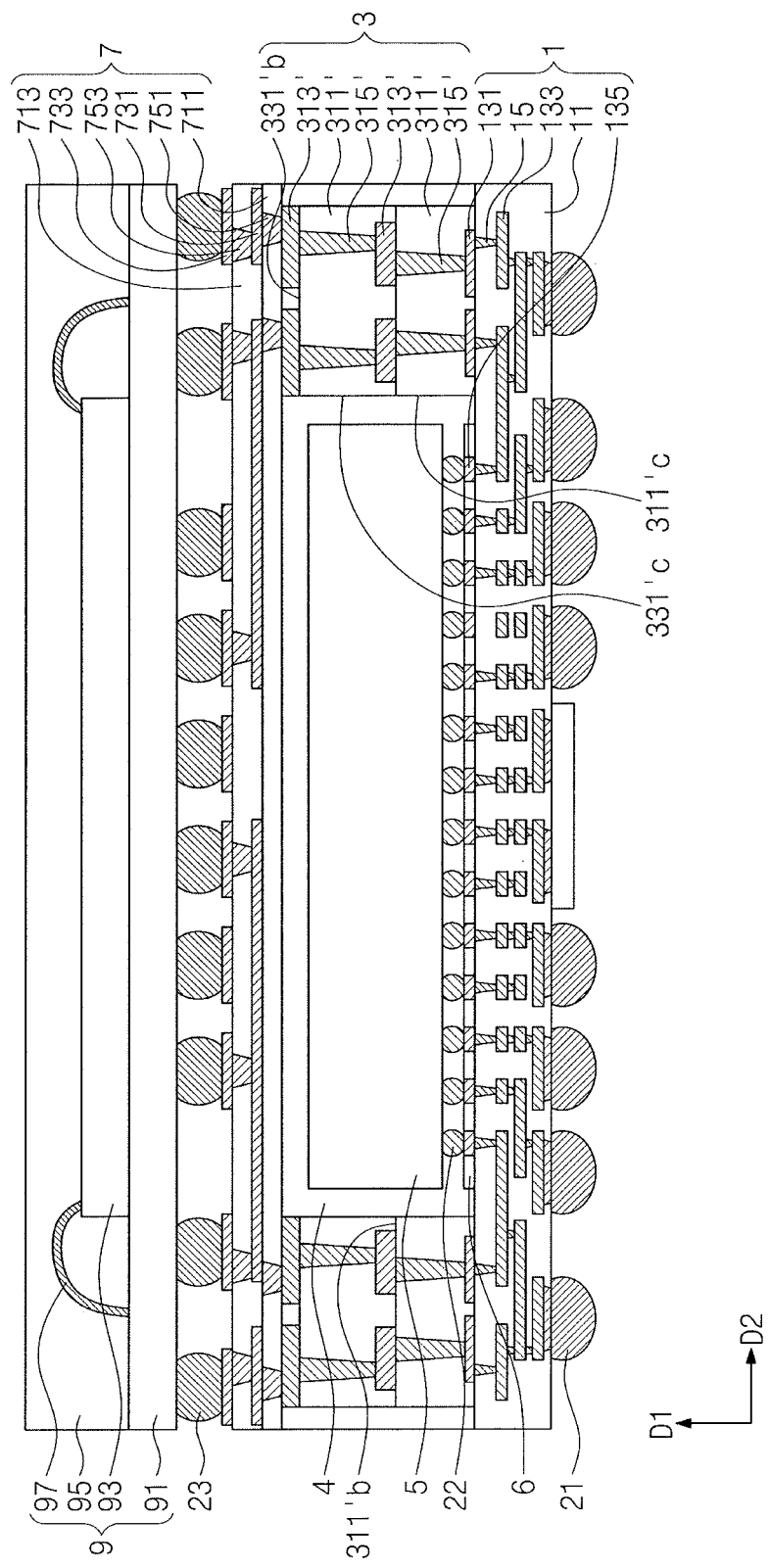
FIG. 10 illustrates a sectional view of a semiconductor package according to an example embodiment.

FIG. 10 is a sectional view illustrating a semiconductor package according to an example embodiment.

In the following description, for concise description, a similar or same element to that in the previously embodiments will be identified by the same reference number as that in the previously embodiments, without repeating an overlapping description thereof.

Referring to FIG. 10, the stack 3 may include a first insulating layer 311', a first via 315', a first interconnection line 313', a second insulating layer 331', a second via 335', and a second interconnection line 333'. A first inner side surface 311'c of the first insulating layer 311' may be formed to be coplanar with a second inner side surface 331'c of the second insulating layer 331'. Thus, the first insulating layer 311' and the second insulating layer 331' may be formed so as not to form a staircase structure. For example, the second insulating layer 331' may be stacked on the first insulating layer 311' so as not to expose a first top surface 311'b of the first insulating layer 311'.

An example in which the stack 3 includes two insulating layers (e.g., 311' and 331') has been described. The stack 3 may be configured to include three or more insulating layers.

Figure 11:
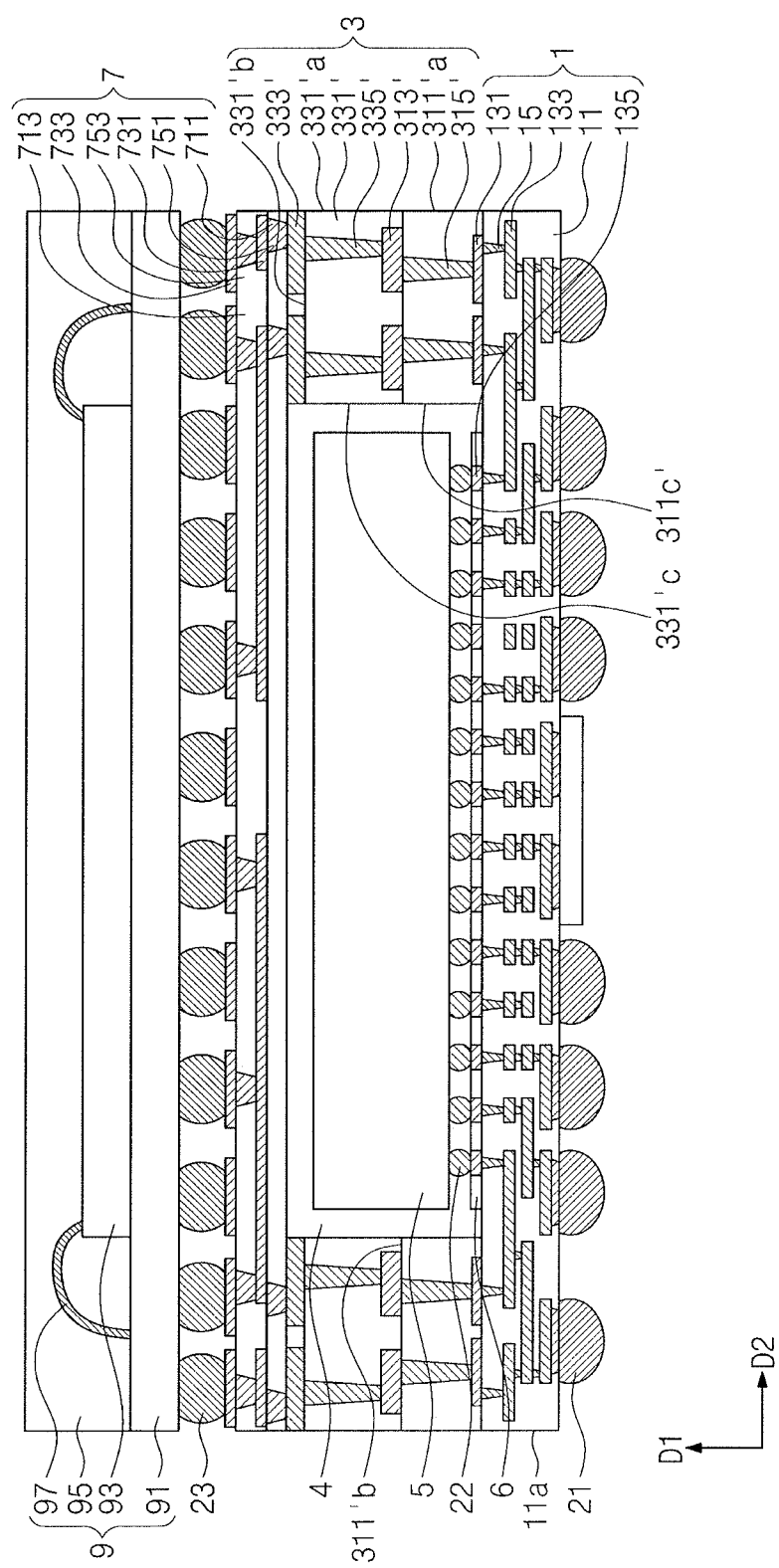
FIG. 11 illustrates a sectional view of a semiconductor package according to an example embodiment.

FIG. 11 is a sectional view illustrating a semiconductor package according to an example embodiment.

In the following description, for concise description, a similar or same element to that in the previously embodiments will be identified by the same reference number as that in the previously embodiments, without repeating an overlapping description thereof.

Referring to FIG. 11, an outer side surface of the stack 3 may not be covered with the mold layer 4. For example, a first outer side surface 311'a of the first insulating layer 311' and/or a second outer side surface 331'a of the second insulating layer 331' may be exposed to the outside. The first outer side surface 311'a and/or the second outer side surface 331'a may be aligned to be coplanar with an outer side surface of the lower redistribution layer 1.

Figure 12:
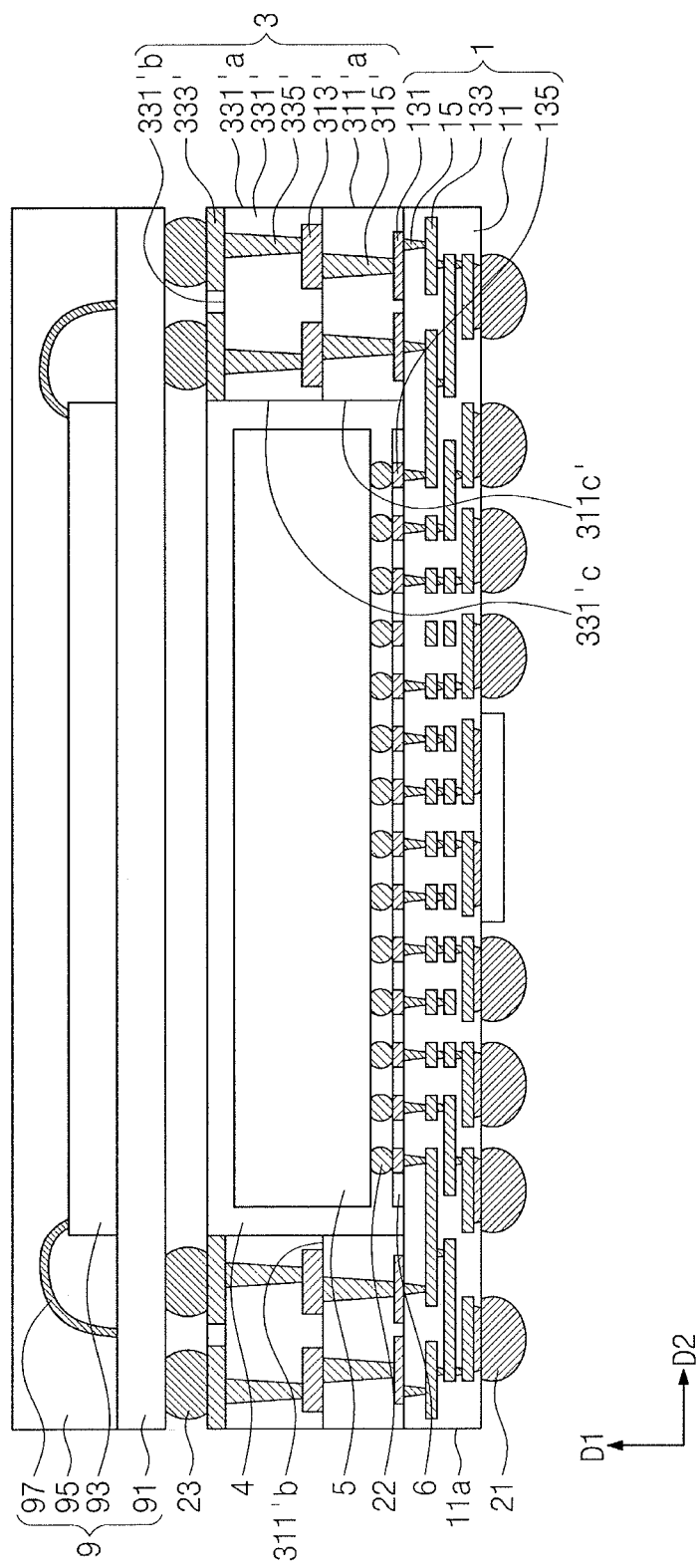
FIG. 12 illustrates a sectional view of a semiconductor package according to an example embodiment.

FIG. 12 is a sectional view illustrating a semiconductor package according to an example embodiment.

In the following description, for concise description, a similar or same element to that in the previously embodiments will be identified by the same reference number as that in the previously embodiments, without repeating an overlapping description thereof.

Referring to FIG. 12, the stack 3 and the upper package 9 may be connected to each other, without the upper redistribution layer interposed therebetween. The second interconnection line 333' may be in direct contact with the upper ball 23. The second interconnection line 333' may be electrically connected to the upper package 9 via the upper ball 23.

Figure 13:
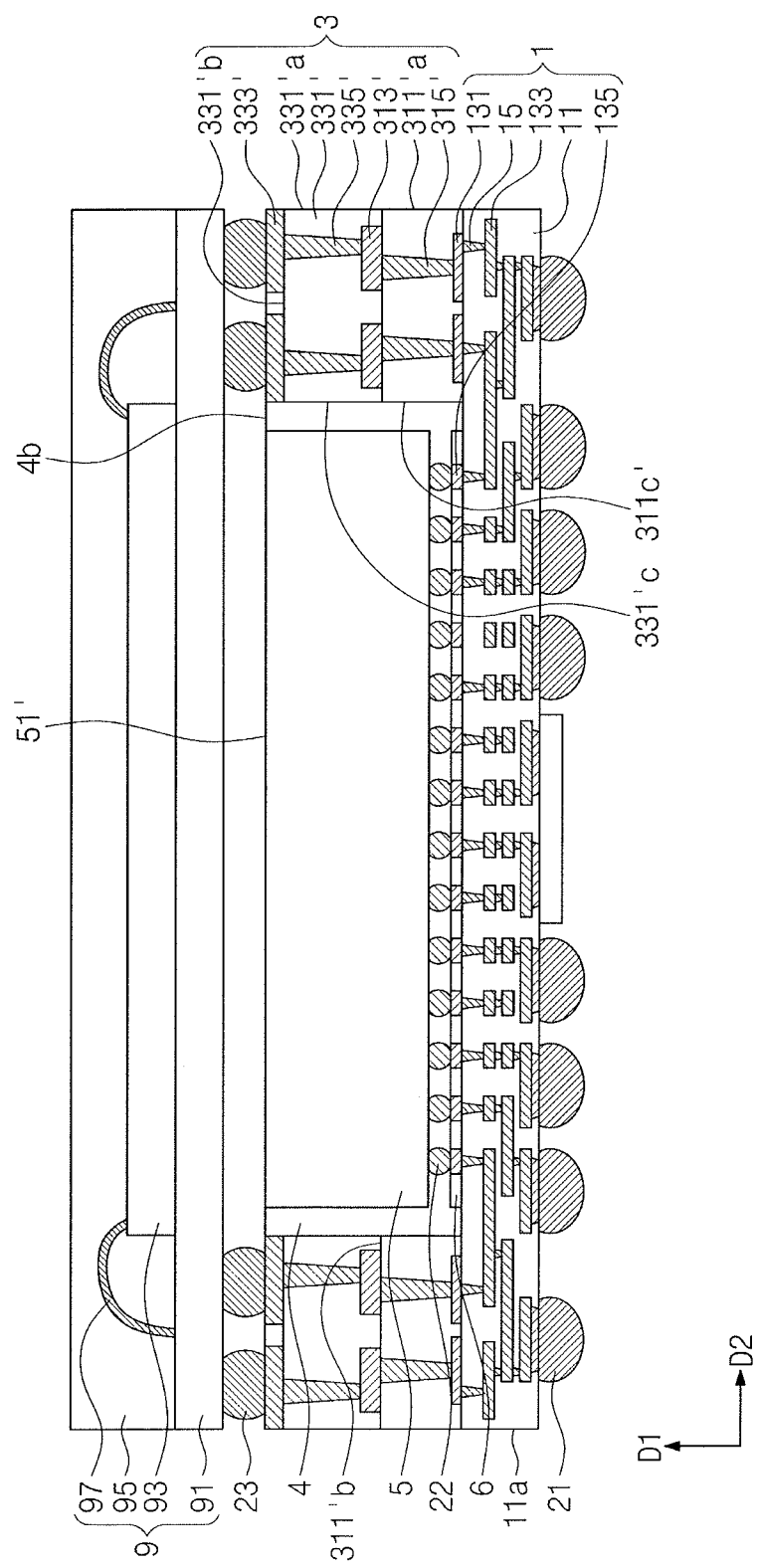
FIG. 13 illustrates a sectional view of a semiconductor package according to an example embodiment.

FIG. 13 is a sectional view illustrating a semiconductor package according to an example embodiment.

In the following description, for concise description, a similar or same element to that in the previously embodiments will be identified by the same reference number as that in the previously embodiments, without repeating an overlapping description thereof.

Referring to FIG. 13, a top surface 4b of the mold layer 4 and a top surface 51' of the semiconductor chip 5 may be substantially coplanar with each other. For example, the mold layer 4 may be formed to expose the top surface 51' of the semiconductor chip 5.

By way of summation and review, a semiconductor package device may include a plurality of semiconductor chips mounted on a package substrate, or may have a structure in which a package is stacked on another package.

As described above, embodiments may provide a method of fabricating a semiconductor package with a redistribution layer using a chip-last process. Embodiments may provide a method capable of reducing a size of vias in a semiconductor package.

In a method of fabricating a semiconductor package according to an example embodiment, a chip-last process may be used to fabricate a package structure including a redistribution layer, and it may be possible to form the redistribution layer and a semiconductor chip through separate processes.

In a method of fabricating a semiconductor package according to an example embodiment, it may be possible to reduce a fabrication time and to improve a production yield.

In a method of fabricating a semiconductor package according to an example embodiment, it may be possible to reduce a size of a via, technical restrictions in constructing a path of the via, and a total volume of a semiconductor package.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
   a lower redistribution layer;
   a stack on a first region of a top surface of the lower redistribution layer; and
   a semiconductor chip on a second region of the top surface of the lower redistribution layer, wherein:
   the stack includes:
      a first insulating layer on the top surface of the lower redistribution layer;
      a second insulating layer on a top surface of the first insulating layer;
      a first via penetrating the first insulating layer; and
      a second via penetrating the second insulating layer,
   the second via has a vertically extending central axis that is spaced apart from a vertically extending central axis of the first via, and
   the second insulating layer is spaced farther from the semiconductor chip than the first insulating layer is, such that the first insulating layer and the second insulating layer form a staircase structure in a direction toward the semiconductor chip.

2. The semiconductor package as claimed in claim 1, wherein:
   the stack further includes:
      a first interconnection line connecting the first via to the second via; and
      a second interconnection line on the second insulating layer, the second interconnection line being connected to the second via, and
   the first via and the second via have an upwardly increasing width.

3. The semiconductor package as claimed in claim 2, wherein the stack further includes:
   a third insulating layer on a top surface of the second insulating layer; and
   a third via penetrating the third insulating layer, and the second interconnection line connects the second via to the third via.

4. The semiconductor package as claimed in claim 1, further comprising an upper redistribution layer on the semiconductor chip and the stack,
   wherein the upper redistribution layer is electrically connected to the lower redistribution layer through the stack.

5. The semiconductor package as claimed in claim 1, wherein the first insulating layer and the second insulating layer include a photo imageable dielectric material.

6. The semiconductor package as claimed in claim 2, wherein:
   the lower redistribution layer includes:
      a lower redistribution insulator;
      a lower redistribution outer terminal provided on the lower redistribution insulator and electrically connected to the first via;
      a lower redistribution pattern provided in the lower redistribution insulator and electrically connected to the lower redistribution outer terminal; and
      a lower redistribution connection terminal provided on the lower redistribution insulator and electrically connected to the lower redistribution pattern,
   the semiconductor chip is electrically connected to the lower redistribution connection terminal, and
   the first via and the first insulating layer are provided to contact a top surface of the lower redistribution outer terminal.

7. A method of fabricating a redistribution structure, the method comprising:
   forming a lower redistribution layer; and
   forming a stack on a first region of a top surface of the lower redistribution layer, the forming of the stack including:
      forming a first insulating layer on a top surface of the lower redistribution layer;
      forming a first via to penetrate the first insulating layer;
      forming a second insulating layer on a top surface of the first insulating layer; and
      forming a second via to penetrate the second insulating layer; and
   disposing a semiconductor chip on a second region of the top surface of the lower redistribution layer, wherein:
   the second via has a vertically extending central axis that is spaced apart from a vertically extending central axis of the first via, and
   the second insulating layer is spaced farther from the semiconductor chip than the first insulating layer is, such that the first insulating layer and the second insulating layer form a staircase structure in a direction toward the semiconductor chip.

8. The method as claimed in claim 7, wherein:
   the forming of the stack further includes:
      forming a first via hole to penetrate the first insulating layer and to expose a portion of an edge region of the lower redistribution layer;
      forming a first hole to penetrate the first insulating layer and to expose a center region of the lower redistribution layer; and forming a second via hole to penetrate the second insulating layer, the first via is formed to fill the first via hole, the second via is formed to fill the second via hole, and the first via and the second via are formed to have an upwardly increasing width.

9. The method as claimed in claim 7, wherein:

the lower redistribution layer includes a lower redistribution outer terminal electrically connected to the first via, and the first via and the first insulating layer are formed to contact a top surface of the lower redistribution outer terminal.

10. A semiconductor package, comprising:

a lower redistribution layer;

a lower semiconductor chip on the lower redistribution layer;

a stack on the lower redistribution layer and laterally spaced apart from the lower semiconductor chip, the lower semiconductor chip being surrounded by the stack, in plan view; and an upper package on the lower semiconductor chip and the stack, wherein:

the stack includes:
 a first insulating layer on the lower redistribution layer;
 a first via penetrating the first insulating layer;
 a second insulating layer on the first insulating layer; and
 a second via penetrating the second insulating layer and having a vertically extending central axis that is spaced apart from a vertically extending central axis of the first via, the upper package includes:
 an upper substrate on the lower semiconductor chip and the stack, and being electrically connected to the lower redistribution layer through the stack; and
 an upper semiconductor chip on the upper substrate, and the first insulating layer and the second insulating layer form a staircase structure in a direction toward the lower semiconductor chip.

11. The semiconductor package as claimed in claim 10, wherein the stack further includes:

a first interconnection line connecting the first via to the second via; and a second interconnection line on the second insulating layer, the second interconnection line being connected to the second via.

12. The semiconductor package as claimed in claim 11, wherein the first via and the second via have an upwardly increasing width.

13. The semiconductor package as claimed in claim 11, wherein:

the stack further includes:
 a third insulating layer on a top surface of the second insulating layer; and
 a third via penetrating the third insulating layer, and the second interconnection line connects the second via to the third via.

14. The semiconductor package as claimed in claim 10, further comprising an upper redistribution layer between the upper substrate and the stack, wherein the upper redistribution layer is electrically connected to the lower redistribution layer through the stack, and the upper redistribution layer is electrically connected to the upper package through upper balls.

15. The semiconductor package as claimed in claim 10, wherein the first insulating layer and the second insulating layer include a photo imageable dielectric material.

16. The semiconductor package as claimed in claim 10, wherein:

the lower redistribution layer includes:
 a lower redistribution insulator;
 a lower redistribution outer terminal provided on the lower redistribution insulator and electrically connected to the first via;
 a lower redistribution pattern provided in the lower redistribution insulator and electrically connected to the lower redistribution outer terminal; and
 a lower redistribution connection terminal provided on the lower redistribution insulator and electrically connected to the lower redistribution pattern, the lower semiconductor chip is electrically connected to the lower redistribution connection terminal, and the first via and the first insulating layer are provided to contact a top surface of the lower redistribution outer terminal.

* * * * *